(12) United States Patent
Takeda et al.

(10) Patent No.: US 8,039,040 B2
(45) Date of Patent: Oct. 18, 2011

(54) METHOD FOR LUMINESCENT LAYER FORMATION AND ORGANIC ELECTROLUMINESCENT DEVICE

(75) Inventors: Toshihiko Takeda, Ichikawa (JP); Shigeru Morito, Matsudo (JP); Masaru Kobayashi, Tsukuba (JP); Hiroyuki Shirogane, Tsukuba (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 948 days.

(21) Appl. No.: 11/914,393

(22) PCT Filed: May 16, 2006

(86) PCT No.: PCT/JP2006/310096
§ 371 (c)(1),
(2), (4) Date: Nov. 14, 2007

(87) PCT Pub. No.: WO2006/123813
PCT Pub. Date: Nov. 23, 2006

(65) Prior Publication Data
US 2009/0081480 A1    Mar. 26, 2009

(30) Foreign Application Priority Data
May 16, 2005 (JP) .................................. 2005-142617

(51) Int. Cl.
*B05D 5/06* (2006.01)
*B05D 1/28* (2006.01)
(52) U.S. Cl. ..................... 427/66; 427/256; 427/428.06; 427/428.2

(58) Field of Classification Search .................... 427/66, 427/256, 428, 6, 428.2
See application file for complete search history.

(56) References Cited

U.S. PATENT DOCUMENTS

| | | | |
|---|---|---|---|
| 6,281,634 B1 | 8/2001 | Yokoyama | |
| 2002/0039872 A1 | 4/2002 | Asai et al. | |
| 2002/0191990 A1* | 12/2002 | Hirano et al. | 399/279 |
| 2003/0089252 A1* | 5/2003 | Sarnecki | 101/170 |
| 2003/0183830 A1 | 10/2003 | Yamazaki et al. | |
| 2003/0218419 A1* | 11/2003 | Bae | 313/504 |
| 2004/0061118 A1 | 4/2004 | Yamazaki et al. | |
| 2004/0160176 A1 | 8/2004 | Kim | |
| 2004/0185604 A1 | 9/2004 | Park et al. | |
| 2004/0202778 A1 | 10/2004 | Nishiguchi et al. | |
| 2004/0303788 | 10/2004 | Nishiguchi et al. | |

(Continued)

FOREIGN PATENT DOCUMENTS
CN  1527646 A1  9/2004
(Continued)

*Primary Examiner* — James Lin
(74) *Attorney, Agent, or Firm* — Burr & Brown

(57) ABSTRACT

A method for the formation of a luminescent layer having a uniform thickness in a desired pattern and an organic electroluminescent device that can realize high-quality display and is highly reliable. The luminescent layer is formed by providing a blanket having a resin film having a surface tension of not less than 35 dynes/cm as a surface layer and an ink for a luminescent layer, having a viscosity (ink temperature 23° C.) in the range of 5 to 200 cP as measured at a shear rate of 100/sec, and containing a solvent having a surface tension of not more than 40 dynes/cm and a boiling temperature in the range of 150 to 250° C., filling the ink into cells in a gravure form, allowing the blanket to receive the ink from the cells, and transferring the ink on the blanket onto a luminescent layer forming face.

10 Claims, 10 Drawing Sheets

U.S. PATENT DOCUMENTS

2004/0265481 A1* 12/2004 Kobayashi ............... 427/66
2005/0142977 A1    6/2005 Park
2005/0164425 A1*  7/2005 Tuomikoski et al. ........ 438/99

FOREIGN PATENT DOCUMENTS

| | | |
|---|---|---|
| GB | 2 428 883 A1 | 2/2007 |
| JP | 08-267952 A1 | 10/1996 |
| JP | 2001-093668 A1 | 4/2001 |
| JP | 2001-291587 A1 | 10/2001 |
| JP | 2003-059656 A1 | 2/2003 |
| JP | 2003-077657 A1 | 3/2003 |
| JP | 2003-308973 A1 | 10/2003 |
| JP | 2004-066736 A1 | 3/2004 |
| JP | 2004-095551 A1 | 3/2004 |
| JP | 2004-111158 A1 | 4/2004 |
| JP | 2004-178915 A1 | 6/2004 |
| JP | 2005-059348 A1 | 3/2005 |

* cited by examiner

METHOD FOR LUMINESCENT LAYER FORMATION AND ORGANIC ELECTROLUMINESCENT DEVICE

FIELD OF THE INVENTION

The prevent invention relates to a method for the formation of a luminescent layer constituting an organic electroluminescent device by gravure offset printing, and an organic electroluminescent device.

BACKGROUND OF THE INVENTION

Organic electroluminescent (EL) elements are advantageous, for example, in that they have high visibility by virtue of a self-luminous type, are solid state displays unlike liquid crystal displays, are less likely to be influenced by a temperature change, and have a large view angle. These advantages have recently led to a trend toward the practical use of these organic electroluminescent elements as organic electroluminescent devices such as full-color display devices, area color display devices, and lighting.

In organic electroluminescent elements, organic luminescent materials constituting the luminescent layer are classified into low molecular type and high molecular type. For example, the high molecular type luminescent layer can be formed by various printing methods or ink jet printing methods, using organic luminescent material-containing inks for a luminescent layer. For example, a method has been proposed in which a luminescent layer is formed by an offset printing method which comprises receiving a thixotropic organic luminescent material-containing ink having a viscosity of 100 to 60000 cP in a silicone blanket from an intaglio and then transferring the ink onto a substrate in a sheet form (Japanese Patent Laid-Open No. 93668/2001). Further, a method has also been proposed in which a luminescent layer is formed by an offset printing method which comprises providing an ink comprising an organic luminescent material contained in a solvent having a water solubility of not more than 5% by weight, receiving the ink in a blanket from an intaglio and then transferring the ink onto a substrate (Japanese Patent Laid-Open No. 291587/2001). Furthermore, a method has been proposed which comprises feeding an ink containing an organic luminescent material onto the surface of a silicone blanket through a gravure roll to form a coating film, pressing the coating film by a relief plate, removing the coating film in its pressed sites, and then transferring the coating film remaining on the surface of the silicone blanket onto a film forming face to form a luminescent layer (Japanese Patent Laid-Open No. 178915/2004).

Furthermore, a method has been proposed in which a luminescent layer is formed by an intaglio offset printing method which comprise providing an ink containing an organic luminescent material and a blanket formed of a silicone elastomer, which, when immersed in a solvent used in this ink, exhibits a volume change of not more than 40%, transferring the ink from the concave part in an intaglio onto the blanket, and further transferring the ink onto a substrate (Japanese Patent Laid-Open No. 308973/2003). Furthermore, a full-color or area-color display device has been proposed as an organic electroluminescent device (Japanese Patent Laid-Open No. 111158/2004). This device is formed by providing an insulating layer in a desired pattern on an anode formed substrate, forming a luminescent element layer including a luminescent layer on an electrode pattern in an insulating layer-free area (luminescence display area), and forming a cathode in a desired pattern on the insulating layer so as to contact with the luminescent element layer.

SUMMARY OF THE INVENTION

In the conventional methods for luminescent layer formation, due to the use of an ink having relatively high viscosity, in filling the ink into concaves in an intaglio by a doctor blade, unsatisfactory scraping or uneven thickness is likely to occur and, thus, the formation of a luminescent layer having uniform thickness is difficult. Further, the ink is likely to penetrate into the silicone blanket. This is disadvantageous in that the formed luminescent layer has a rough surface and, at the same time, the printing durability of the silicone blanket is lowered.

A luminescent layer having uniform thickness can be formed by spin coating an ink containing an organic luminescent material on a substrate and drying the coating. The spin coating, however, is disadvantageous in that, in forming a luminescent layer in a desired pattern, the spin coating method should be combined with photolithography and, thus, the process is complicated. The spin coating method has an additional drawback that the utilization efficiency of the ink for luminescent layer formation is low. On the other hand, an ink jet method can easily form a patterned luminescent layer, but on the other hand, when the regulation of the fluidity of the ejected ink, surface tension and the like is unsatisfactory, the formation of a luminescent layer having uniform thickness is difficult.

Furthermore, regarding conventional organic electroluminescent devices as full-color or area-color display devices, there is a limitation on an improvement in display quality due to the uneven thickness of the luminescent layer. When sites, which are defective in the formation of the luminescent element layer, are present in an insulating layer-free area (luminescence display area), disadvantageously, shortcircuiting between the anode and the cathode occurs resulting in significantly lowered reliability.

The present invention has been made with a view to solving the above problems of the prior art, and an object of the present invention is to provide a method for the formation of a luminescent layer in a uniform layer thickness in a desired pattern and to provide an organic electroluminescent device which can realize a high-quality display that is also highly reliable.

The above object can be attained by a method for the formation of a luminescent layer in an organic electroluminescent device comprising opposed electrodes, a luminescent element layer provided between the electrodes, the luminescent element layer comprising at least a luminescent layer, the method comprising the steps of:

filling an ink, for a luminescent layer, comprising at least an organic luminescent material into cells in a gravure form;

allowing a blanket to receive the ink for a luminescent layer from the cells; and then transferring the ink for a luminescent layer on the blanket onto a luminescent layer forming face, wherein the blanket has a resin film having a surface tension of not less than 35 dynes/cm as a surface layer, the ink for a luminescent layer has a viscosity (ink temperature 23° C.) in the range of 5 to 200 cP as measured at a shear rate of 100/sec, and a solvent having a surface tension of not more than 40 dynes/cm and a boiling temperature in the range of 150 to 250° C. is used in the ink for a luminescent layer.

In a preferred embodiment of the method according to the present invention, the resin film has a thickness of 5 to 200 μm.

In an embodiment of the method according to the present invention, the blanket comprises the resin film provided integrally on the circumferential surface of a blanket cylinder.

In a preferred embodiment of the method according to the present invention, the resin film is transferred in such a state that the resin film is wound around the circumferential surface of the blanket cylinder being rotated in its portion ranging at least from a position where the ink for a luminescent layer is received from the gravure form, to a position where the ink for a luminescent layer is transferred to the luminescent layer forming face.

In a preferred embodiment of the present invention, a cushioning layer is provided on the surface of the blanket cylinder.

In a preferred embodiment of the method according to the present invention, the content of the organic luminescent material in the ink for a luminescent layer is in the range of 1.5 to 4.0% by weight.

In a preferred embodiment of the method according to the present invention, cells in the gravure form has a maximum opening length in the range of 20 to 200 μm and a depth of 10 to 200 μm.

In a preferred embodiment of the method according to the present invention, in the gravure form, a plurality of cells constitute a pattern for one area color, and the width of one pattern is not less than 200 μm.

In a preferred embodiment of the method according to the present invention, a plurality of luminescent layers different from each other in luminescent color are continuously formed using a plurality of pairs of gravure forms and blankets.

In a preferred embodiment of the method according to the present invention, the gravure form is divided into a plurality of compartments in an axial direction, and any desired ink for a luminescent layer is supplied for each of the compartments to simultaneously form a plurality of luminescent layers different from each other in luminescent color.

According to the present invention, there is provided an organic electroluminescent device comprising: a transparent base material; a transparent electrode layer provided in a desired pattern on the transparent base material; an insulating layer provided on the transparent base material, the insulating layer having a plurality of openings for allowing the electrode layer in its desired sites to be exposed; a luminescent element layer provided so as to cover the transparent electrode layer within the openings and to be extended onto the insulating layer in its part located on the peripheral part of the opening, the luminescent element layer including at least a luminescent layer; and an electrode layer provided so as to be connected to the luminescent element layer located within any desired opening among the openings, the luminescent layer in the luminescent element layer has been formed by the above method.

Further, according to the present invention, there is provided an organic electroluminescent device comprising: a base material; an electrode layer provided in a desired pattern on the base material; an insulating layer provided on the base material, the insulating layer having a plurality of openings for allowing the electrode layer in its desired sites to be exposed; a luminescent element layer provided so as to cover the electrode layer within the openings and to be extended onto the insulating layer in its part located on the peripheral part of the opening, the luminescent element layer including at least a luminescent layer; and a transparent electrode layer provided so as to be connected to the luminescent element layer located within any desired opening among the openings, the luminescent layer in the luminescent element layer has been formed by the above method.

In a preferred embodiment of the organic electroluminescent device according to the present invention, in the luminescent layer constituting the luminescent element layer, the variation in thickness of the sites located within the openings is not more than 10%.

In a preferred embodiment of the organic electroluminescent device according to the present invention, the luminescent element layer comprises at least a hole injection layer, a luminescent layer, and an electron injection layer stacked in that order.

In a preferred embodiment of the organic electroluminescent device according to the present invention, the organic electroluminescent device is of a passive matrix type or active matrix type.

In a preferred embodiment of the organic electroluminescent device according to the present invention, the organic electroluminescent device is an organic electroluminescent poster comprising the openings having a maximum opening width of not less than 10 mm in the insulating layer.

In a preferred embodiment of the organic electroluminescent device according to the present invention, the organic electroluminescent device comprises a color filter layer.

In a preferred embodiment of the organic electroluminescent device according to the present invention, the organic electroluminescent device further comprises a color converting fluorescent material layer provided between the color filter layer and the transparent electrode.

In a preferred embodiment of the organic electroluminescent device according to the present invention, in the luminescent element layer, luminescent layers of a desired luminescent color including white are provided, or luminescent layers of respective desired luminescent colors are provided in combination to in a predetermined pattern.

In a preferred embodiment of the organic electroluminescent device according to the present invention, the luminescent element layer emits blue light, and the color converting fluorescent material layer comprises a green conversion layer for converting blue light to green fluorescence and emitting the green fluorescent light, and a red conversion layer for converting blue light to red fluorescence and emitting the red fluorescent light.

In a preferred embodiment of the organic electroluminescent device according to the present invention, the organic electroluminescent device comprises a hole injection layer and a luminescent layer formed by forming a coating film for the hole injection layer, then forming a coating film for the luminescent layer within one min after the formation of the coating film for the hole injection layer, and simultaneously drying these two layers in a temperature range of 100 to 200° C.

According to the method for luminescent layer formation according to the present invention, the luminescent layer can be formed in a uniform thickness. Further, for each luminescence color, the luminescent layer can be formed in a desired pattern. Furthermore, the luminescent layer can also be formed on flexible base materials such as resin film base materials, and, at the same time, printing durability of the blanket is very high, and, thus, the production cost of the organic electroluminescent device can also be reduced.

Further, in the organic electroluminescent device according to the present invention, since the luminescent element layer is provided so as to be extended onto the insulating layer in its part on the periphery of the opening, there is no fear of causing shortcircuiting between electrodes located opposite to each other through the luminescent element layer and, thus, high reliability can be realized. Further, since the luminescent layer in the luminescent element layer is produced by the method according to the present invention, the thickness of the luminescent layer is uniform and high-quality display can be realized. Accordingly, the present invention is useful for the production of various organic electroluminescent devices such as full-color display devices, area color display devices, and lighting.

DETAILED DESCRIPTION OF THE INVENTION

The present invention will be described with reference to the accompanying drawings.

<Method for Luminescent Layer Formation>

Figure 1:
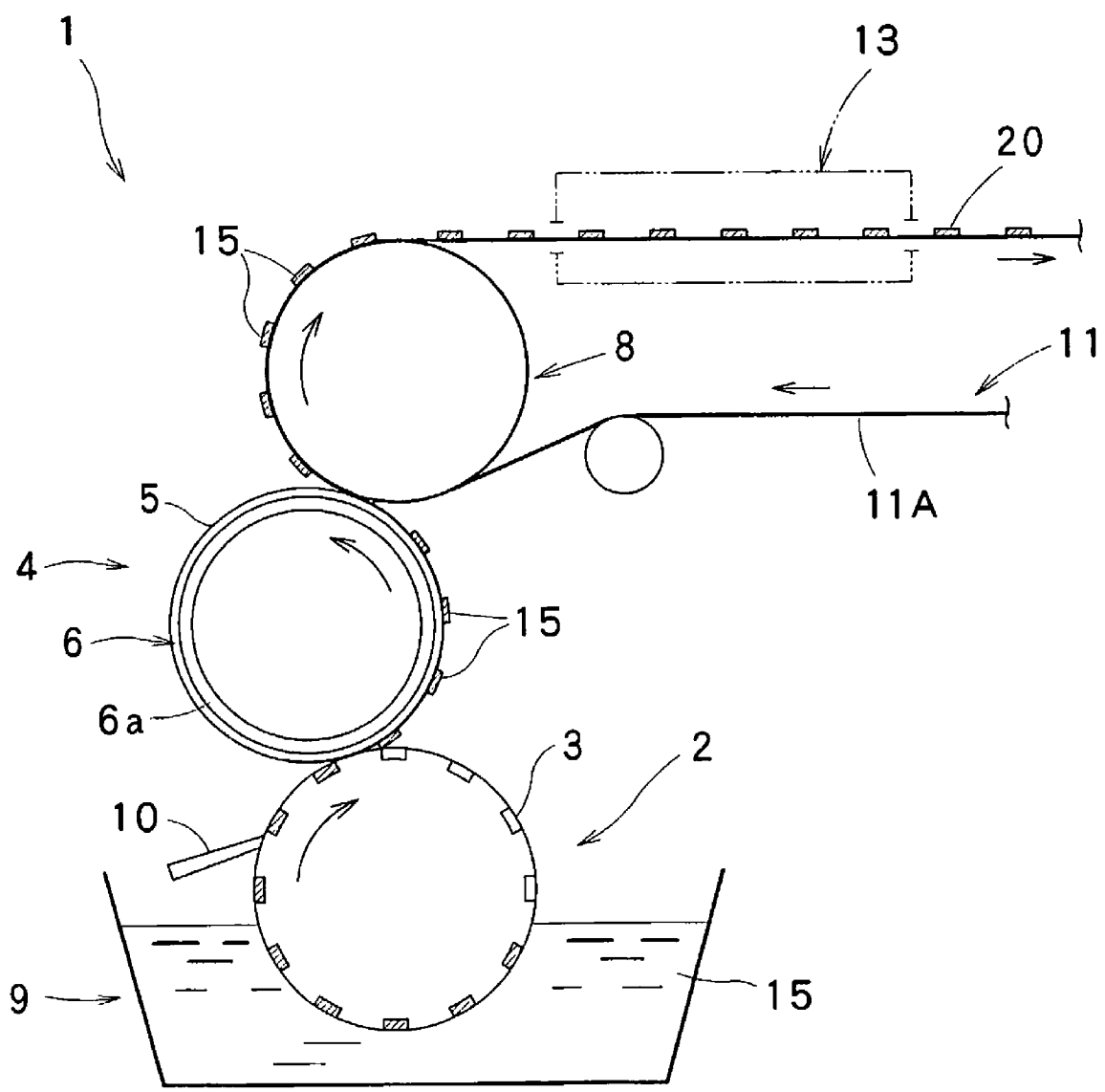
FIG. 1 is a diagram illustrating the method for luminescent layer formation according to the present invention.

FIG. 1 is an explanatory diagram illustrating the method for luminescent layer formation according to the present invention. In FIG. 1, an ink 15 for a luminescent layer contained in an ink pan 9 constituting a printing unit 1 is supplied onto the surface of a gravure form 2 being rotated. An unnecessary portion of the ink 15 for a luminescent layer is scraped away by a doctor blade 10, and, thus, the ink 15 for a luminescent layer is supplied only into cells 3. The ink 15 for a luminescent layer within the cells 3 is received in the blanket 4 and is then transferred onto a luminescent layer forming face 11A in a base material 11 being carried onto an impression cylinder 8. This base material 11 is carried to a drying zone 13 where the ink 15 for a luminescent layer is dried to form a luminescent layer 20.

In the present invention, an assembly comprising a resin film 5 having a surface tension of not less than 35 dynes/cm, preferably 35 to 65 dynes/cm, provided as a surface layer on the surface of a blanket cylinder 6 is used as the blanket 4. An ink having a viscosity of 5 to 200 cP, preferably 20 to 150 cP, as measured under conditions of shear rate 100/sec and ink temperature 23° C., a solvent surface tension of not more than 40 dynes/cm, preferably 20 to 37 dynes/cm, and a boiling point of 150 to 250° C., preferably 170 to 230° C., is used as the ink 15 for a luminescent layer.

When the surface tension of the resin film 5 constituting the surface layer of the blanket 4 is less than 35 dynes/cm, the receptivity of the ink from the gravure form 2 is is lowered and, consequently, the formation of a luminescent layer 20 having a uniform thickness is difficult. The surface tension (surface tension of solid [γs]) of the resin film 5 is determined by measuring the contact angle θ with an automatic contact angle goniometer (model DropMaster 700, manufactured by Kyowa Interface Science Co., Ltd.) using two or more liquids (standard substances) of which the surface tension is known, and determining the surface tension of the solid based on the following equation: γs (surface tension of solid)=γL (surface tension of liquid) cos θ+γSL (surface tension of solid and liquid).

Examples of the resin film 5 used include resin films such as polyethylene terephthalate films, easy adhesion-type polyethylene terephthalate films, corona-treated polyethylene terephthalate films, polyphenylene sulfide films, corona-treated polyphenylene sulfide films, polyethylene naphthalate films, easy adhesion-type polyethylene naphthalate films, polynorbornene films, and melamine-based polyethylene terephthalate films. The thickness of the resin film 5 may be, for example, in the range of 5 to 200 μm, preferably 10 to 100 μm. When the thickness of the resin film 5 is less than 5 μm, film processability and mountability on the blanket cylinder 6 are disadvantageously deteriorated. On the other hand, when the thickness of the resin film 5 exceeds 200 μm, the hardness is so high that the flexibility is disadvantageously lowered.

In FIG. 1, the blanket cylinder 6 has on its surface a cushioning layer 6a. The hardness of the cushioning layer 6a may be, for example, in the range of 20 to 80°. The thickness may be, for example, in the range of 0.1 to 30 mm. The above hardness is type A hardness as measured by a durometer hardness test specified in JIS K 6253.

Figure 2:
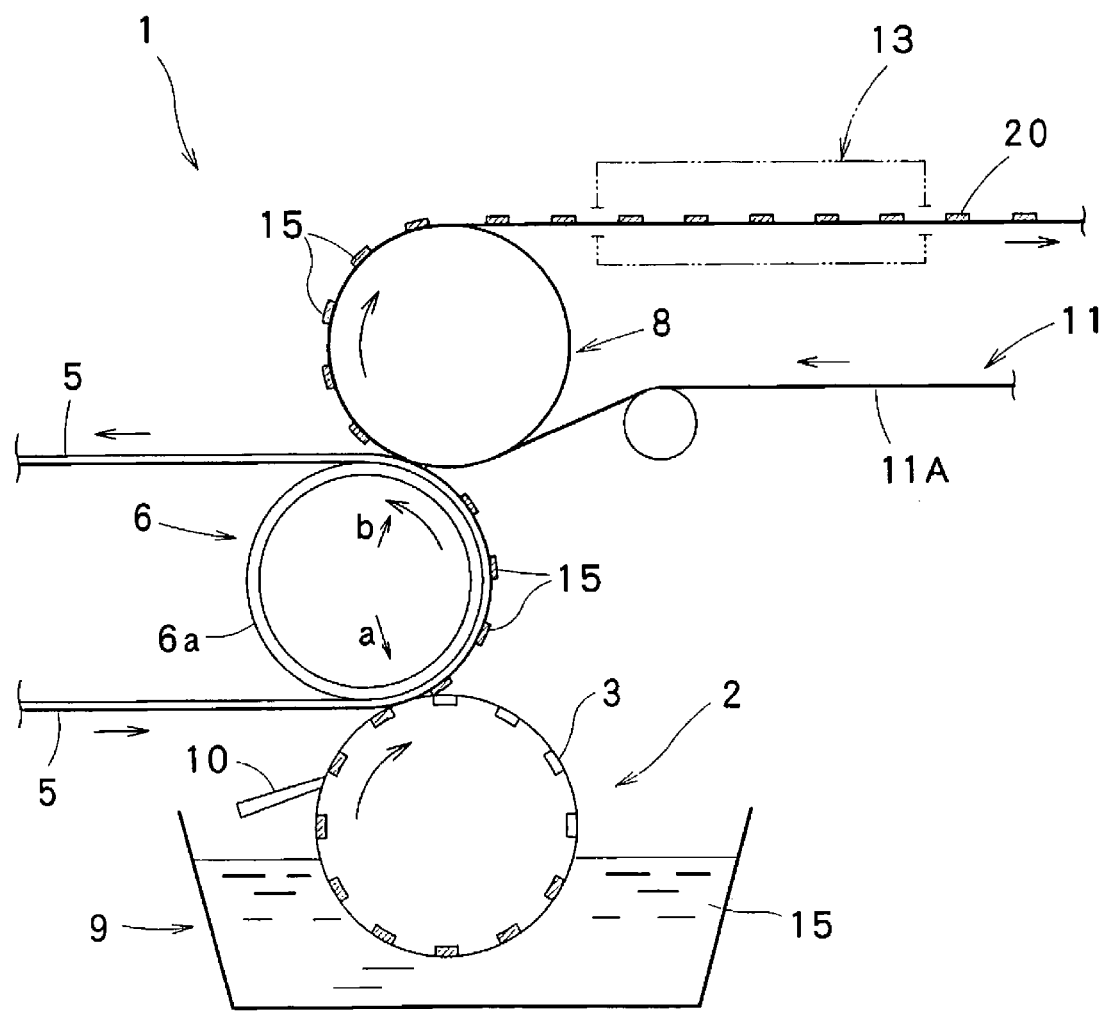
FIG. 2 is a diagram illustrating the method for luminescent layer formation according to the present invention.

In the embodiment shown in FIG. 1, the resin film 5 is mounted integrally on the blanket cylinder 6. Alternatively, an embodiment as shown in FIG. 2 may be adopted in which the resin film 5 is transferred with the rotation of the blanket cylinder 6 so as to be wound around the blanket cylinder 6. In this case, the resin film 5 should be wound around the blanket cylinder 6 in its portion ranging at least from a position where the ink 15 for a luminescent layer is received from the gravure form 2 (a position indicated by an arrow a), to a position where the ink 15 for a luminescent layer is transferred to the luminescent layer forming face 11A (a position indicated by an arrow b). A construction may be adopted in which the resin film 5 is transferred and fed from a feed roll (not shown) onto the blanket cylinder 6 and is wound up around a wind-up roller (not shown). Further, a construction may be adopted in which a resin film 5 in an endless form is used and is transferred on an endless track provided between a roller (not shown) and the blanket cylinder 6.

Figure 3:
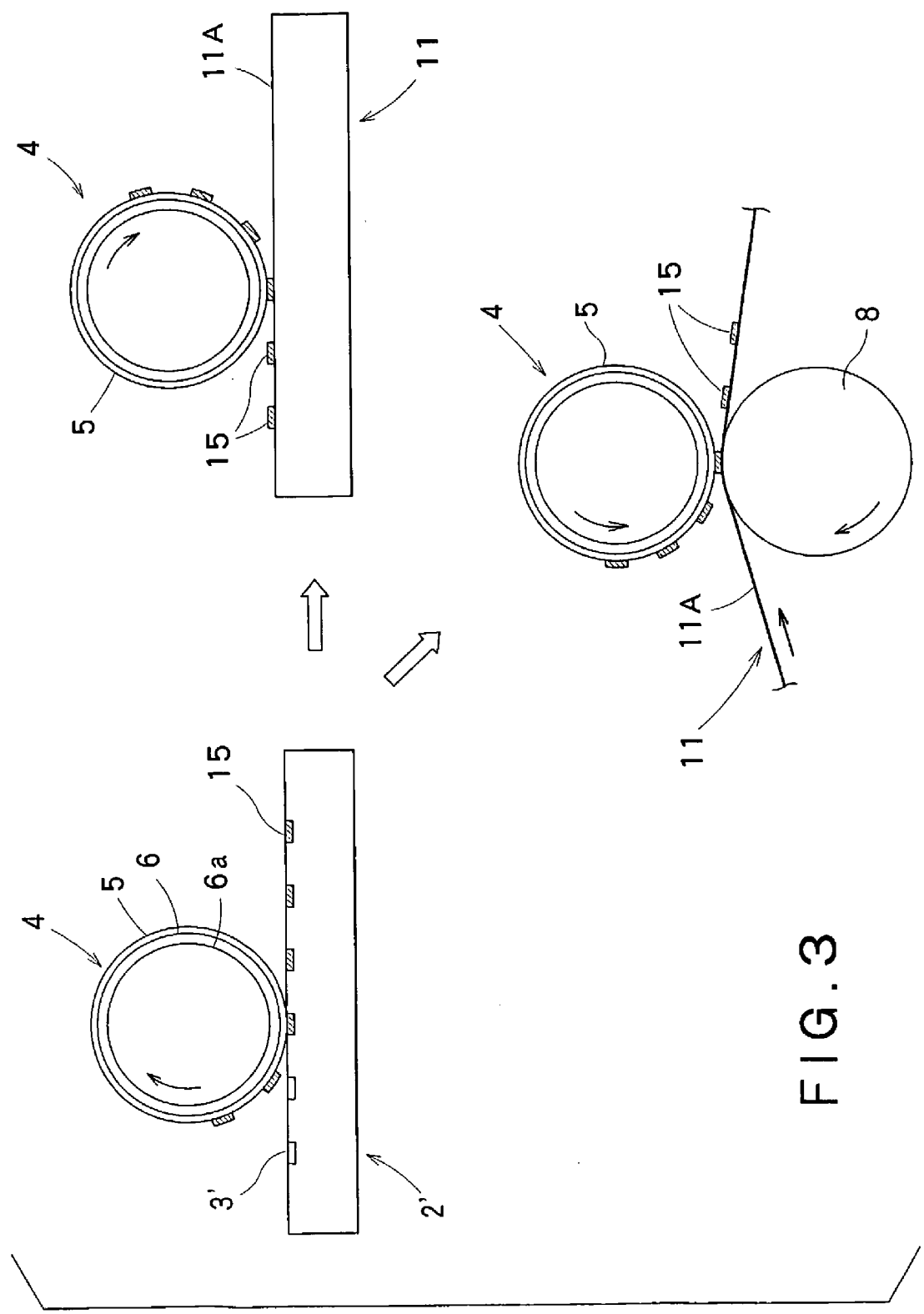
FIG. 3 is a diagram illustrating the method for luminescent layer formation according to the present invention.

In the present invention, the gravure form may be in a plate form. FIG. 3 is a diagram showing this embodiment. In FIG. 3, at the outset, an ink 15 for a luminescent layer is fed onto the surface of a plate-shaped gravure form 2', and an unnecessary portion of the ink 15 for a luminescent layer is scraped away with a doctor blade (not shown) to feed the ink 15 for a luminescent layer only into cells 3'. Next, the ink 15 for a luminescent layer within the cells 3' is received in a blanket 4 and is then transferred onto a luminescent layer forming face 11A in a plate-shaped base material 11, followed by drying to form a luminescent layer. Alternatively, the ink 15 for a luminescent layer may be transferred on a luminescent layer forming face 11A in the base material 11 being transferred on an impression cylinder 8, followed by drying to form a luminescent layer.

When the viscosity of the ink 15 for a luminescent layer is less than 5 cP as measured under conditions of shear rate 100/sec and ink temperature 23° C., ink sagging occurs, or the formation of a luminescent layer having a desired thickness becomes difficult. On the other hand, when the viscosity exceeds 200 cP, concaves and convexes derived from cell dot marks of the gravure form 2 are large, making it difficult to form a luminescent layer having a uniform thickness. The viscosity is measured with a viscoelasticity measuring apparatus (model MCR 301, manufactured by Physica) in a steady flow measurement mode at a temperature of 23° C. Further, preferably, for the ink 15 for a luminescent layer, the ratio between viscosity V1 as measured under conditions of shear rate 100/sec and ink temperature 23° C. and viscosity V2 as measured under conditions of shear rate 1000/sec and ink temperature 23° C., that is, V1/V2, is about 0.9 to 1.5, that is, the ink 15 substantially exhibits Newtonian flow.

When the surface tension of a solvent used in the ink 15 for a luminescent layer exceeds 40 dynes/cm, the receptivity of the ink 15 for a luminescent layer from the gravure form 2 is disadvantageously deteriorated. When the boiling point of the solvent in the ink 15 for a luminescent layer is below 150° C., the ink 15 for a luminescent layer transferred from the resin film 5 constituting the blanket 4 onto the base material 11 in its luminescent layer forming face 11A is immediately dried and, consequently, streaks are likely to occur in the luminescent layer 20. When the boiling point is above 250° C., drying becomes difficult. Disadvantageously, this sometimes has an adverse effect, for example, on the base material 11 in drying in a drying zone 13 or causes a part of the solvent to remain unremoved. The surface tension of the solvent is measured with a surface tension balance (model CBVP-Z, manufactured by Kyowa Interface Science Co., Ltd.) at a liquid temperature of 20° C.

For example, the following coloring matter, metal complex, and polymeric organic luminescent materials may be mentioned as the organic luminescent material usable in the ink 15 for a luminescent layer.

(1) Coloring Matter Luminescent Material

Coloring matter luminescent materials include cyclopentadiene derivatives, tetraphenylbutadiene derivatives, triphenylamine derivatives, oxadiazole derivatives, pyrazoloquinoline derivatives, distyrylbenzene derivatives, distyrylarylene derivatives, silole derivatives, thiophene ring compounds, pyridine ring compounds, perinone derivatives, perylene derivatives, oligothiophene derivatives, trifumanylamine derivatives, oxadiazole dimmers, and pyrazoline dimmers.

(2) Metal Complex Luminescent Material

Metal complex luminescent materials include, for example, quinolinol aluminum complexes, benzoquinolinol beryllium complexes, benzoxazole zinc complexes, benzothiazole zinc complexes, azomethyl zinc complexes, porphyrin zinc complexes, europium complexes, and metal complexes in which Al (aluminum), Zn (zinc), Be (beryllium) or the like or a rare earth metal such as Tb (terbium), Eu (europium), or Dy (dysprosium) is present as a central metal, and the ligand has an oxadiazole, thiadiazole, phenylpyridine, phenybenzoimidazole, quinoline or other structure.

(3) Polymeric Luminescent Material

Polymeric luminescent materials include poly-p-phenylenevinylene derivatives, polythiophene derivatives, poly-p-phenylene derivatives, polysilane derivatives, polyacetylene derivatives, polyvinylcarbazole derivatives, and polyfluorene derivatives.

The content of the above organic luminescent material in the ink 15 for a luminescent layer may be set, for example, in the range of 1.5 to 4.0% by weight.

The solvent used in the ink 15 for a luminescent layer satisfies the requirements that the surface tension is in the above-defined range (not more than 40 dynes/cm) and the boiling point is in the above-defined range (150 to 250° C.). Examples of such solvents include cumene, anisole, n-propylbenzene, mesitylene, 1,2,4-trimethylbenzene, limonene, p-cymene, o-dichlorobenzene, butylbenzene, diethylbenzene, 2,3-dihydrobenzofuran, methyl benzoate, 1,2,3,4-tetramethylbenzene, amyl benzene, tetralin, ethyl benzoate, phenylhexane, cyclohexylbenzene, and butyl benzoate. They may be used solely.

When a mixed solvent is used, the mixed solvent should have the above-defined surface tension and boiling point as calculated based on the proportion depending upon the mixing ratio. For example, in the case of a mixed solvent composed of a solvent 1 having a surface tension of A dynes/cm and a boiling point of B° C. and a solvent 2 having a surface tension of C dynes/cm and a boiling point of D° C. at a weight ratio of 3:7, the surface tension as calculated based on the proportion depending upon the mixing ratio [(A×3/10)+(C×7/10)] should be in the above-defined range (not more than 40 dynes/cm), and, at the same time, the boiling point as calculated based on the proportion depending upon the mixing ratio [(B×3/10)+(D×7/10)] should be in the above-defined range (150 to 250° C.). Accordingly, the surface tension and the boiling point of the individual solvents constituting the mixed solvent may be outside the above range so far as the surface tension and boiling point of the mixed solvent as calculated based on the proportion depending upon the mixing ratio are in the above-defined respective ranges.

In the method for luminescent layer formation according to the present invention, preferably, the maximum opening length of cells 3 in the gravure form 2 is in the range of 20 to 200 μm, preferably 30 to 170 μm, and the depth is in the range of 10 to 200 μm, preferably 15 to 150 μm. When the maximum opening length of cells 3 is less than 20 μm, the formation of a luminescent layer having a desired thickness is difficult. On the other hand, when the maximum opening length exceeds 200 μm, scraping-away of the unnecessary ink by the doctor blade 10 is unsatisfactory.

Figure 4:
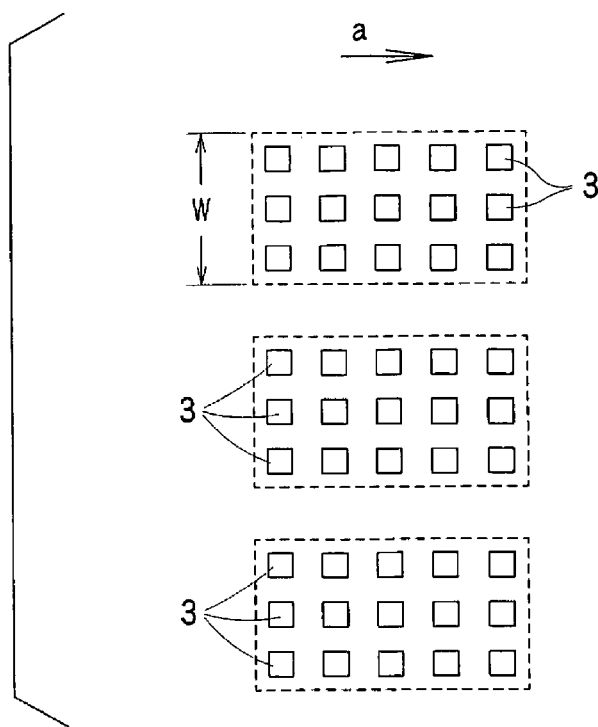
FIG. 4 is a diagram illustrating cell in a gravure form.

Further, in the method for luminescent layer formation according to the present invention, cells may be provided in the gravure form 2 so that a plurality of cells constitute a pattern for one area color. FIG. 4 shows this embodiment. In the embodiment shown in FIG. 4, a plurality of cells 3 (15 cells in the embodiment shown in the drawing) constitute a pattern (the shape indicated by a chained line). In this case, the width W of one pattern may be not less than 200 μm, preferably not less than 300 μm. The pattern width W is the minimum width in a direction orthogonal to the direction of rotation (a direction indicated by an arrow a in FIG. 4) of the gravure form 2. When the pattern width W is less than 200 μm, the variation in thickness around the edge of the pattern is disadvantageously not less than 10%.

Figure 5:
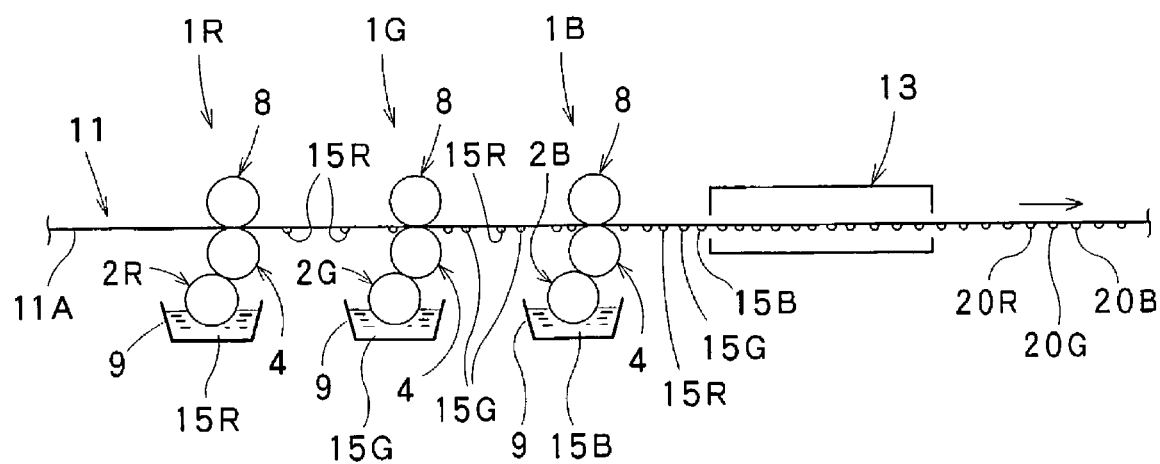
FIG. 5 is a diagram illustrating the method for luminescent layer formation according to the present invention.

In the method for luminescent layer formation according to the present invention, a plurality of luminescent layers different from each other in luminescence color may be continuously formed using a plurality of pairs of gravure forms and blankets. FIG. 5 shows this embodiment. This system includes a unit 1R comprising a gravure form 2R for red luminescent layer formation, a blanket 4, and an impression cylinder 8, a unit 1G comprising a gravure form 2G for green luminescent layer formation, a blanket 4, and an impression cylinder 8, and a unit 1B comprising a gravure form 2B for blue luminescent layer formation, a blanket 4, and an impression cylinder 8. The units 1R, 1G, and 1B are the same as the above-described printing unit 1. Ink pans 9 in the units 1R, 1G, and 1B are supplied with corresponding ink 15R for a red luminescent layer, ink 15G for a green luminescent layer, and ink 15B for a blue luminescent layer. In the order of the units 1R, 1G, and 1B, the ink 15R for a red luminescent layer, the ink 15G for a green luminescent layer, and the ink 15B for a blue luminescent layer are continuously transferred onto a base material 11 in its luminescent layer forming face 11A side, followed by drying to form a red luminescent layer 20R, a green luminescent layer 20G, and a blue luminescent layer 20B. In this case, any desired formation pattern for the luminescent layers and the like may be adopted, and the order of formation of the luminescent layers is not limited to the above-described order.

Figure 6:
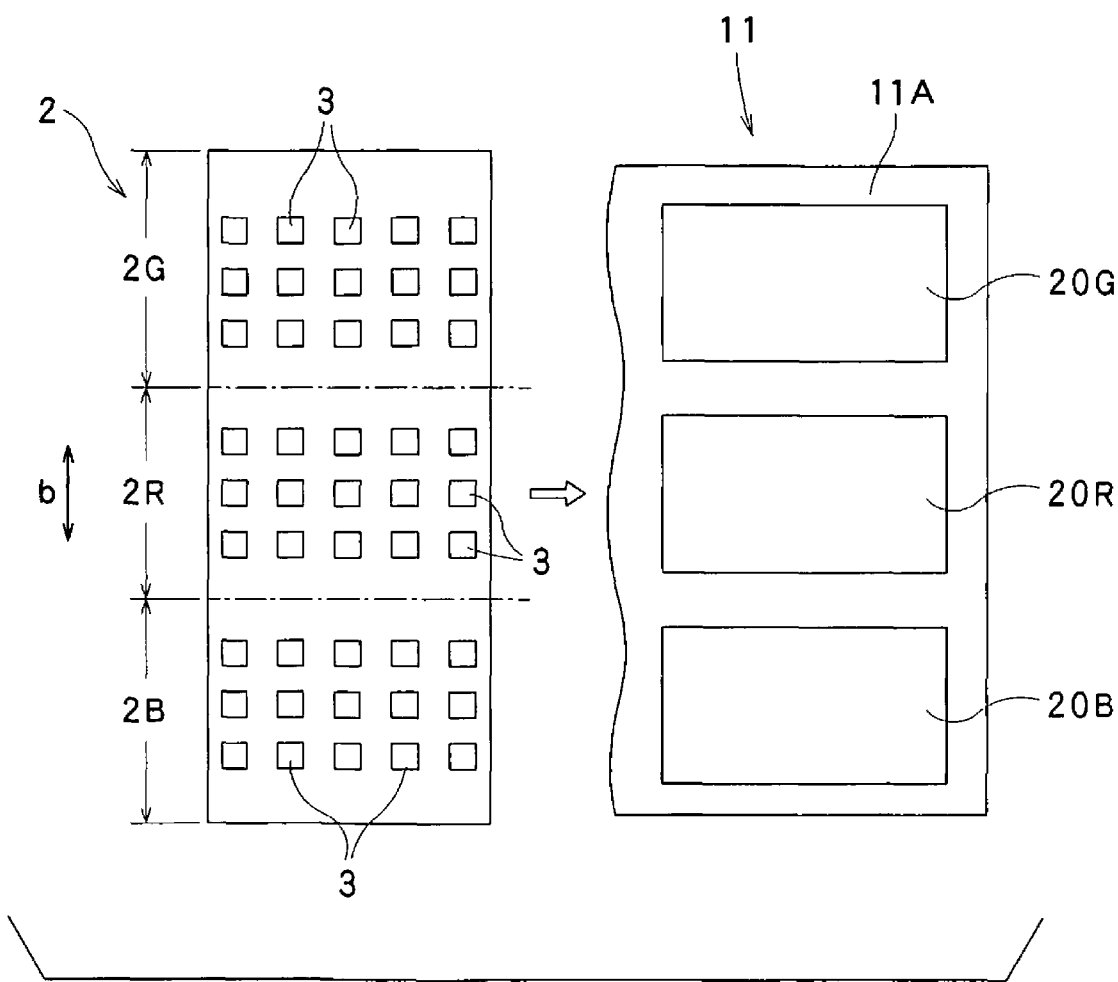
FIG. 6 is a diagram illustrating the method for luminescent layer formation according to the present invention.

In an embodiment of the method for luminescent layer formation according to the present invention, the gravure form 2 is divided into a plurality of compartment in the axial direction, and any desired ink for a luminescent layer is fed for each compartment for simultaneous formation of a plurality of luminescent layers different from each other in luminescent color. FIG. 6 is a diagram illustrating this embodiment. In FIG. 6, the gravure form 2 is divided into three compartments (2G, 2R, 2B) in the axial direction (a direction indicated by an arrow b), and a plurality of cells 3 for the formation of a pattern for an area color are provided in each compartment. The ink 15G for a green luminescent layer, the ink 15R for a red luminescent layer, and the ink 15B for a blue luminescent layer are fed into the compartments 2G, 2R, and 2B, respectively, for example, by a dispenser method, and, as described above, the ink 15R for a red luminescent layer, the ink 15G for a green luminescent layer, and the ink 15B for a blue luminescent layer are simultaneously transferred onto the base material 11 in its luminescent layer forming face 11A side, followed by drying to form a red luminescent layer 20R, a green luminescent layer 20G, and a blue luminescent layer 20B as area color patterns. The design pattern, dimension, positional relationship and the like may be set as desired.

The blanket 4 in the above embodiment is rotated in a forward direction to the direction of the rotation of the gravure form 2 and the impression cylinder 8. Depending upon the luminescent layer pattern to be formed, however, the blanket 4 may be rotated in a direction opposite to the direction of rotation of the gravure form 2 and the impression cylinder 8. The base material 11 may be in a sheet form, and the feed of the ink 15 for a luminescent layer to the gravure form 2 may be carried out, for example, by a dispenser without the use of the ink pan 9.

<Organic Electroluminescent Device>

Figure 7:
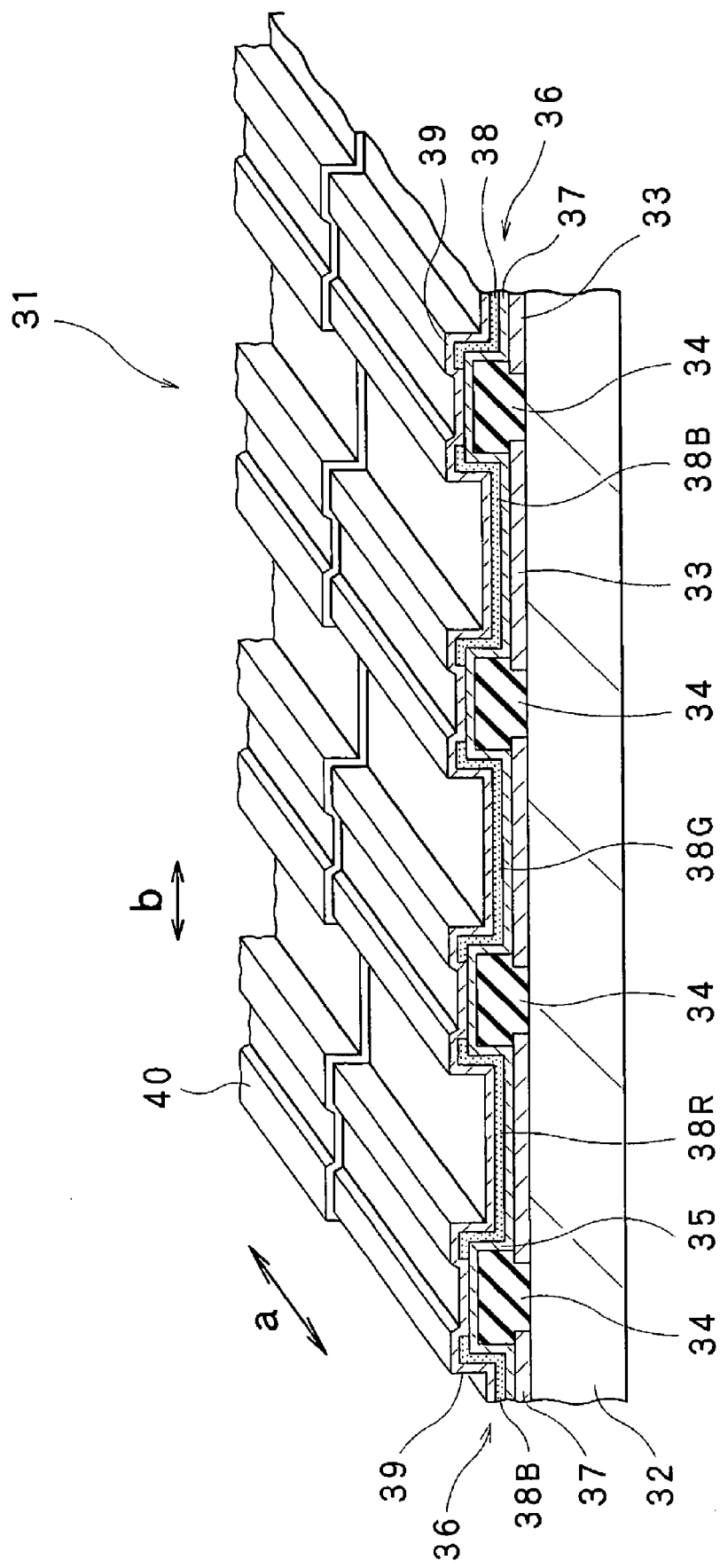
FIG. 7 is a partially sectional perspective view showing one embodiment of the organic electroluminescent device according to the present invention.

FIG. 7 is a partially sectional perspective view showing one embodiment of the organic electroluminescent device. In FIG. 7, an organic electroluminescent device 31 comprises a transparent base material 32, a plurality of transparent electrode layers 33 provided, on the transparent base material 32, in a strip pattern extended in a direction indicated by an arrow a, an insulating layer 34 having stripe-shaped openings 35, a luminescent element layer 36 provided so as to cover the transparent electrode layer 33 within the stripe-shaped opening 35 located on each of the transparent electrode layers 33, and a plurality of electrode layers 40 in a strip-shaped pattern extended in an direction indicated by an arrow b orthogonal to the transparent electrode layer 33 on the luminescent element layer 36. The openings 35 in the insulating layer 34 are stripe-shaped openings along a direction indicated by an arrow a and are located respectively on the transparent electrode layers 33.

The luminescent element layer 36 comprises a hole injection layer 37 provided so as to cover the insulating layer 34 and the transparent electrode layer 33 within each of the openings 35, a plurality of luminescent layers 38 provided for each opening 35 so as to cover the transparent electrode layer 33 (hole injection layer 37) within the opening 35 and to be extended onto the insulating layer 34 in its part located on the peripheral part of the opening 35, and an electron injection layer 39 provided so as to cover them. In FIG. 7, in the luminescent layer 38, a red luminescent layer 38R, a green luminescent layer 38G, and a blue luminescent layer 38B in a strip-shaped pattern are repeatedly arranged in that order. The electron injection layer 39 is provided so as to cover the insulating layer 34. Alternatively, the electron injection layer 39 may be provided only in an area which is to underly the electrode layer 40.

This organic electroluminescent device 31 is of a passive matrix type in which a site, where the strip-shaped patterned transparent electrode layer 33 intersects with the electrode layer 40, constitutes a luminescent area. The luminescent layer 38 in the luminescent element layer 36 is a luminescent layer formed by the method for luminescent layer formation according to the present invention. The organic electroluminescent device 31 is highly reliable, because the luminescent element layer 36 provided so as to be extended onto the insulating layer 34 in its part on the periphery of the opening 35 can prevent shortcircuiting between the transparent electrode layer 33 and the electrode layer 40 located at a position where the luminescent element layer 36 is held between the transparent electrode layer 33 and the electrode layer 40. Further, the luminescent layer 38 in the luminescent element layer 36 is formed by the method according to the present invention, and, thus, the variation in thickness is not more than 10%, that is, the thickness is uniform. Accordingly, high-quality display can be realized. The variation in thickness of the luminescent layer 38 is calculated by the following equation: [(maximum thickness−minimum thickness)/average thickness]×100 (%). The thickness of the luminescent layer 38 is measured with Nanopics 1000 manufactured by Seiko Instruments Inc. using a cantilever for a contact mode provided as a standard device in this apparatus under conditions of measurement area 100 μm and scanning speed 90 sec/frame.

Next, each member constituting the organic electroluminescent device 31 according to the present invention will be described. The transparent base material 32 constituting the organic electroluminescent device 31 is generally provided on the surface of the device on its observer side and has transparency on such a level that light emitted from the luminescent layer 38 can easily be viewed by the observer. As will be described later, when the direction in which light emitted from the luminescent layer 38 is taken out is opposite to the above case, an opaque substrate may be used instead of the transparent substrate 32.

The transparent substrate 32 (or the opaque substrate used instead of the transparent substrate) may be formed of, for example, a glass material, a resin material, or a composite material composed of these materials, for example, a composite material comprising a glass plate and a protective plastic film or a protective plastic layer provided on the glass plate.

Such resin materials and protective plastic materials include, for example, fluororesins, polyethylenes, polypropylenes, polyvinyl chlorides, polyvinyl fluorides, polystyrenes, ABS resins, polyamides, polyacetals, polyesters, polycarbonates, modified polyphenylene ethers, polysulfons, polyallylates, polyetherimides, polyamide-imides, polyimides, polyphenylene sulfides, liquid crystalline polyesters, polyethylene terephthalates, polybutylene terephthalates, polyethylene naphthalates, polyoxymethylenes, polyethersulfones, polyetherether ketones, polyacrylates, acrylonitrile-styrene resins, phenol resins, urea resins, melamine resins, unsaturated polyester resins, epoxy resins, polyurethanes, silicone resins, and amorphous polyolefins. Other resin materials may also be used so far as the materials are polymeric materials usable for organic electroluminescent devices. The thickness of the transparent substrate 32 is generally about 50 µm to 1.1 mm.

More preferably, the transparent substrate 32 has good gas barrier properties, for example, against water vapor and oxygen, although this also depends upon applications. Further, a gas barrier layer having barrier properties against water vapor, oxygen and the like may be formed on the transparent substrate 32. The gas barrier layer may be formed, for example, by subjecting an inorganic oxide such as silicon oxide, aluminum oxide, or titanium oxide to physical vapor deposition such as sputtering or vacuum vapor deposition.

In the embodiment shown in the drawing, the transparent electrode layer 33 constituting the organic electroluminescent device 31 is an anode which, in order to inject positive charges (holes) into the luminescent layer 38, is provided adjacent to the hole injection layer 37. Alternatively, the transparent electrode layer 33 may be a cathode. In this case, the position of the hole injection layer 37 and the position of the electron injection layer 39 in the luminescent element layer 36 are changed to each other.

The transparent electrode layer 33 is not particularly limited so far as it is a transparent electrode layer commonly used in conventional organic electroluminescent devices. Materials for the transparent electrode layer 33 include metals, alloys, and mixtures thereof, for example, thin film electrode materials such as indium tin oxide (ITO), indium oxide, indium zinc oxide (IZO), zinc oxide, stannic oxide, or gold. Among them, ITO, IZO, indium oxide, and gold, which have a large work function (not less than 4 eV) and are transparent or semi-transparent, are preferred from the viewpoint of easy injection of holes.

Preferably, the transparent electrode layer 33 has a sheet resistance of not more than several hundreds of Ω/□. The thickness of the transparent electrode layer 33 may be, for example, about 0.005 to 1 µm although the thickness also varies depending upon the material.

This transparent electrode layer 33 is extended in a desired pattern form from the peripheral terminal part to the central pixel area. This patterned transparent electrode layer 33 is formed by forming a film in a pattern form, for example, by sputtering or vacuum vapor deposition using a metal mask, or by forming a film on the whole area, for example, by sputtering or vacuum vapor deposition, and then etching the film using a photosensitive resist as a mask.

The insulating layer 34 constituting the organic electroluminescent device 31 has stripe-shaped openings 35 located respectively on the transparent electrode layers 33. This insulating layer 34 may be formed, for example, by coating a photosensitive resin material on the whole area so as to cover the transparent electrode layer 33 and then subjecting the coating to pattern exposure and development, or by using a heat curable resin material. The insulating layer 34 formed parts are nonluminescent parts. The thickness of the insulating layer 34 may be properly determined depending upon the insulating resistance inherent in the resin constituting the insulating layer 34 and may be, for example, about 0.05 to 5.0 µm. Alternatively, the insulating layer 34 may be formed by mixing the above resin material with carbon black, or light shielding fine particles of one or two or more types of titanium-type black pigments such as titanium nitride, titanium oxide, and titanium oxynitride to form a black matrix as the insulating layer 34. The shape of the insulating layer 34 is not limited to the above shape.

In the embodiment shown in the drawing, the luminescent element layer 36 constituting the organic electroluminescent device 31 has a structure comprising, as viewed from the transparent electrode layer 33 side, a hole injection layer 37, a luminescent layer 38, and an electron injection layer 39 stacked in that order. Other structures which may be adopted in the luminescent element layer 36 include a structure composed of a luminescent layer 38 alone, a structure composed of a hole injection layer 37 and a luminescent layer 38, a structure composed of a luminescent layer 38 and an electron injection layer 39, a structure comprising a hole transport layer interposed between the hole injection layer 37 and the luminescent layer 38, and a structure comprising an electron transport layer interposed between the luminescent layer 38 and the electron injection layer 39. In the above structures, luminescence wavelength may be regulated, or the above layers may be doped with a suitable material, for example, from the viewpoint of improving the luminescence efficiency.

In the embodiment shown in the drawing, the luminescent layer 38 in the luminescent element layer 36 comprises a red luminescent layer 38R, a green luminescent layer 38G, and a blue luminescent layer 38B. Depending, for example, upon the purpose of use of the organic electroluminescent device, however, a luminescent layer of desired luminescence color (for example, yellow, light blue, or orange) may be used solely, or alternatively, for example, a desired combination of a plurality of luminescence colors other than the red luminescence, green luminescence, and blue luminescence. Organic luminescent materials as described above in the method for luminescent layer formation according to the present invention may be used as organic luminescent materials used in the luminescent layer 38 in the luminescent element layer 36.

Doping materials, hole transport materials, hole injection materials, electron injection materials and the like used in the layers in the luminescent element layer 36 may be any of inorganic materials and organic materials which will be exemplified below. The thickness of each layer in the luminescent element layer 36 is not particularly limited and may be, for example, about 10 to 1000 nm.

Doping Material

Doping materials include perylene derivatives, coumarin derivatives, rubrene derivatives, quinacridone derivatives, squalium derivatives, porphyrin derivatives, styryl coloring matters, tetracene derivatives, pyrazoline derivatives, decacyclene, and phenoxazone.

Hole Transport Material

Hole transport materials include oxadiazole compounds, oxazole compounds, triazole compounds, thiazole compounds, triphenylmethane compounds, styryl compounds, pyrazoline compounds, hydrazone compounds, aromatic amine compounds, carbazole compounds, polyvinylcarbazole compounds, stilbene compounds, enamine compounds, azine compounds, triphenylamine compounds, butadiene compounds, polycyclic aromatic compounds, and stilbene dimers. π conjugated polymers include polyacetylene, polydiacetylene, poly(p-phenylene), poly(p-phenylene sulfide), poly(p-phenylene oxide), poly(1,6-heptadiene), poly(p-phenylenevinylene), poly(2,5-thienylene), poly(2,5-pyrrole), poly(m-phenylene sulfide), and poly(4,4'-biphenylene).

Charge transfer polymer complexes include polystyrene-AgCl 104, polyvinylnaphthalene-TCNE, polyvinylnaphthalene-P-CA, polyvinylnaphthalene-DDQ, polyvinylmesitylene-TCNE, polynaphthaleneacetylene-TCNE, polyvinylanthracene-Br$_2$, polyvinylanthracene-12, polyvinylanthracene-TNB, polydimethylaminostyrene-CA, polyvinylimidazole-CQ, poly-p-phenylene-12, poly-1-vinylpyridine-12, poly-4-vinylpyridine-12, poly-p-1-phenylene-12, and polyvinylpyridium-TCNQ. Charge transfer low-molecular complexes include TCNQ-TTF, and polymeric metal complexes include poly-copper phthalocyanine. Preferred hole transfer materials include materials having low ionization potential. Butadiene, enamine, hydrazone, and triphenylamine compounds are particularly preferred.

Hole Injection Material

Hole injection materials include phenylamine compounds, star-burst amine compounds, phthalocyanine compounds, oxides such as vanadium oxide, molybdenum oxide, ruthenium oxide, and aluminum oxide, amorphous carbon, polyaniline, polythiophene derivatives, triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, polysilane compounds, aniline copolymers, and dielectric polymeric oligomers such as thiophene oligomers.

Hole injection materials include porphyrin compounds, aromatic tertiary amine compounds, and styrylamine compounds. Porphyrin compounds include porphyn, 1,10,15,20-tetraphenyl-21H,23H-porphyn copper(II), aluminum phthalocyanine chloride, and copper octamethylphthalocyanine. Further, aromatic tertiary amine compounds and styrylamine compounds include N,N,N',N'-tetraphenyl-4,4'-diaminophenyl, N,N'-diphenyl-N,N'-bis(3-methylphenyl)-[1,1'-biphenyl]-4,4'-diamine, 4-(di-p-tolylamino)-4'-[4(di-p-tolylamino)styryl]stilbene, 3-methoxy-4'-N,N-diphenylaminostilbenzene, 4,4'-bis[N-(1-naphthyl)-N-phenylamino]biphenyl, and 4,4',4''-tris[N-(3-methylphenyl)-N-phenylamino]triphenylamine.

Electron Injection Material

Electron injection materials include calcium, barium, aluminium lithium, lithium fluoride, strontium, magnesium oxide, magnesium fluoride, strontium fluoride, calcium fluoride, barium fluoride, aluminum oxide, strontium oxide, calcium oxide, polymethyl methacrylate, sodium polystyrenesulfonate, nitro-substituted fluorene derivatives, anthraquinodimethane derivatives, diphenylquinone derivatives, thiopyrandioxide derivatives, heterocyclic tetracarboxylic anhydrides such as naphthalene perylene, carbodiimides, fluorenylidenemethane derivatives, anthraquinodimethane and anthrone derivatives, oxadiazole derivatives, thiazole derivatives in which an oxygen atom in the oxadiazole ring has been replaced by a sulfur atom, quinoxaline derivatives having a quinoxaline ring known as an electron-withdrawing group, metal complexes of 8-quinolinol derivatives such as tris(8-quinolinol)aluminum, phthalocyanine, metal phthalocyanine, and distyrylpyrazine derivatives.

Regarding the formation of each layer constituting the luminescent element layer 36, the luminescent layer 38 is formed by the method for luminescent layer formation according to the present invention. The hole injection layer 37 and the electron injection layer 39 may be formed, for example, by vacuum vapor deposition through a photomask having openings corresponding to the image display area (a mask for preventing film formation on an electrode terminal formed of the transparent electrode layer 33 in its peripheral part). The hole injection layer 37 and the electron injection layer 39 may also be formed by printing methods such as screen printing.

The hole injection layer 37 and the luminescent layer 38 may also be formed by forming a coating film for a hole injection layer and then forming a coating film for a luminescent layer within one min after the coating for hole injection layer, and simultaneously drying these two layers in a temperature range of 100 to 200° C. In this case, the coating film for a hole injection layer may also be formed using an ink for a hole injection layer having a viscosity (ink temperature 23° C.) in the range of 5 to 200 cP as measured at a shear rate of 100/sec, a solvent surface tension of not more than 40 dynes/cm and a boiling temperature in the range of 150 to 250° C. in the same manner as in the method for luminescent layer formation according to the present invention.

In the embodiment shown in the drawing, the electrode layer 40 constituting the organic electroluminescent device 31 is a cathode and is provided adjacent to the electron injection layer 39 for the injection of negative charges (electrons) into the luminescent layer 38. Alternatively, the electrode layer 40 may be an anode. In this case, the position of the hole injection layer 37 and the position of the electron injection layer 39 constituting the luminescent element layer 36 are changed to each other.

The material for the electrode layer 40 is not particularly limited so far as the material is used in conventional organic electroluminescent devices, and examples thereof include those described in the transparent electrode layer 33, that is, thin film electrode materials such as indium tin oxide (ITO), indium oxide, indium zinc oxide (IZO), zinc oxide, stannic oxide, or gold, and, further, magnesium alloys, for example, MgAg, aluminum or its alloys such as AlLi, AlCa, and AlMg, and silver. Among them, for example, magnesium alloys, aluminum, and silver, which have a small work function (not more than 4 eV), are preferred from the viewpoint of facilitating electron injection. Preferably, the electrode layer 40 has a sheet resistance of not more than several hundreds of Ω/□. To this end, the thickness of the electrode layer 40 may be, for example, about 0.005 to 0.5 μm.

The electrode layer 40 may be formed in a pattern form using the above electrode material, for example, by sputtering or vacuum vapor deposition through a mask.

In the organic electroluminescent device 31 according to the present invention, for example, the direction in which light is taken out can be made opposite by adopting a transparent electrode layer as the electrode layer 40 in the above organic electroluminescent device 31. In this case, the base material 32 may not be transparent, and the transparent electrode layer 33 may be an opaque electrode layer.

Figure 8:
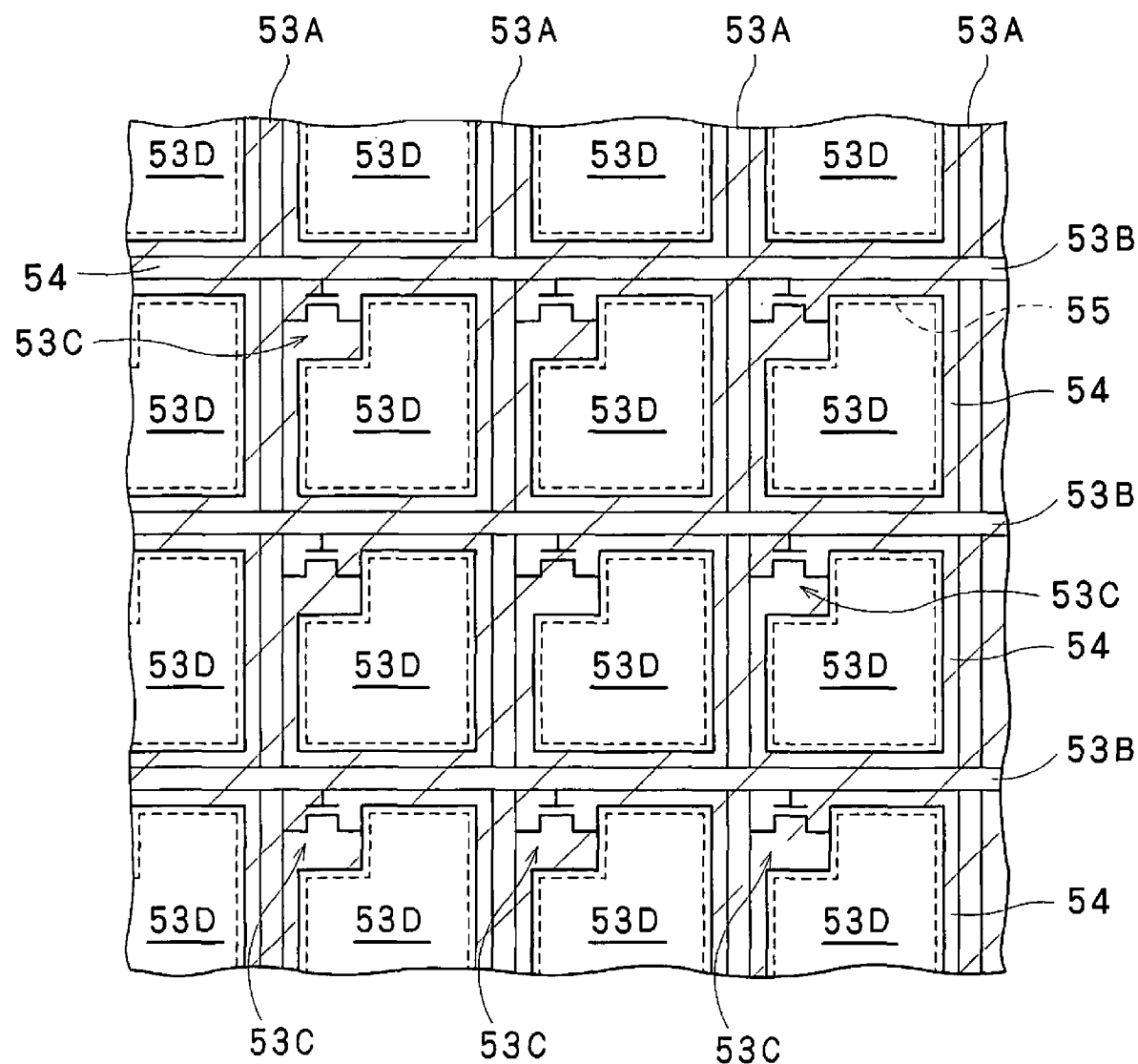
FIG. 8 is a plan view showing another embodiment of the organic electroluminescent device according to the present invention.
Figure 9:
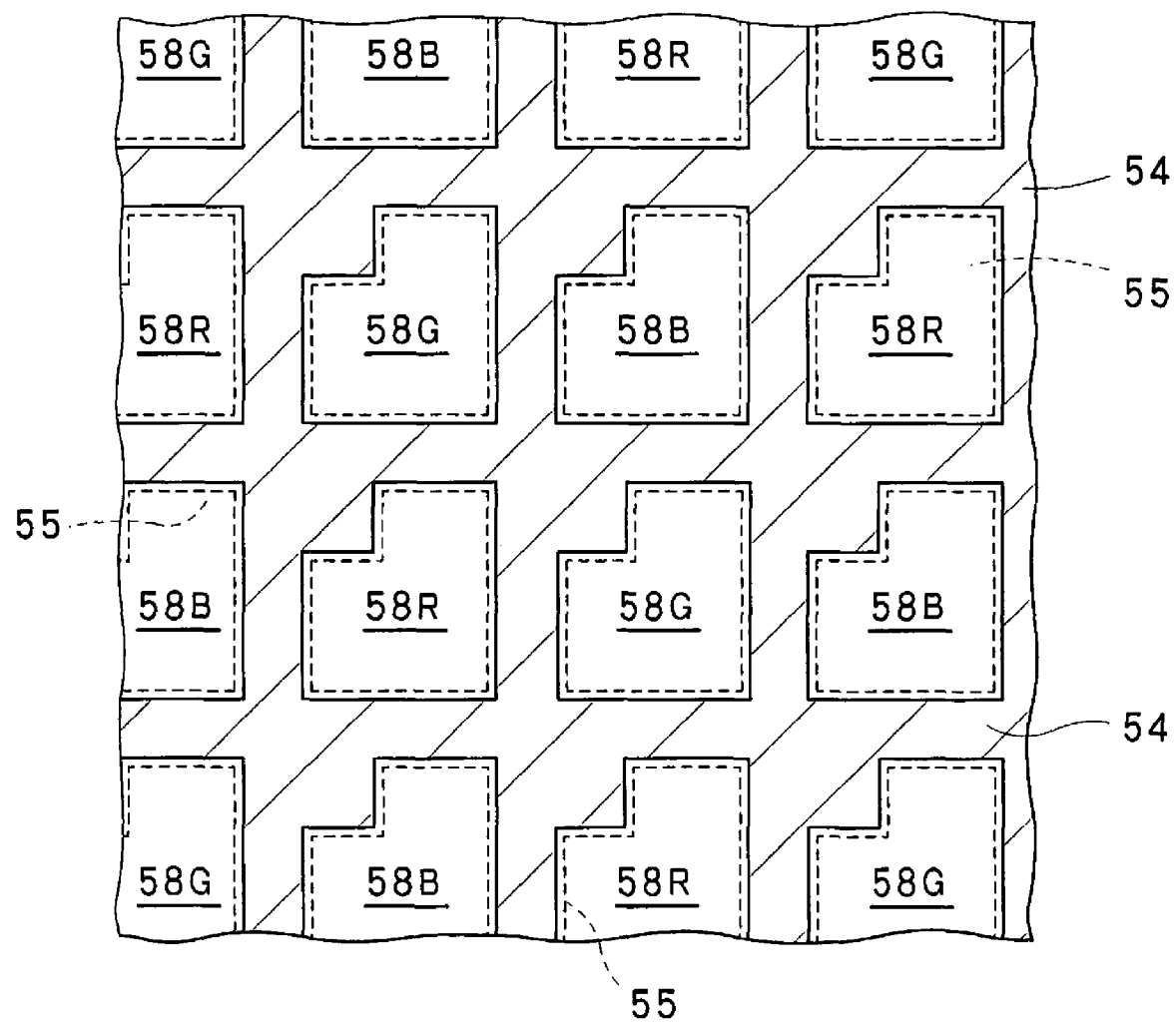
FIG. 9 is a diagram showing the relationship between a luminescent layer and openings in an insulating layer.

The organic electroluminescent device according to the present invention may also be of an active matrix type. FIGS. 8 and 9 are diagrams illustrating one embodiment of an active matrix-type organic electroluminescent device according to the present invention. FIG. 8 is a diagram showing an electrode wiring pattern. An electrode wiring pattern 53 provided on a transparent base material (not shown) comprises a signal wire 53A, a scanning line 53B, TFT (thin film transistor) 53C, and a transparent electrode (pixel electrode) layer 53D. The insulating layer 54 (a site indicated by an oblique line in FIG. 8) is formed so as to cover these electrode wiring patterns 53. This insulating layer 54 has openings 55 located on each of the transparent electrode layers 53D. Further, in the insulating layer 54, a luminescent element layer (not shown) is formed so as to cover the transparent electrode layer 53D within each opening 55, and an electrode (common electrode) layer (not shown) is provided on the luminescent element layer.

The luminescent element layer may comprise a hole injection layer provided so as to cover the insulating layer 54 and the transparent electrode layer 53D within each of the openings 55, a plurality of luminescent layers provided for each opening 55 so as to cover the transparent electrode layer 53D (hole injection layer) within the opening 55 and to be extended onto the insulating layer 54 in its part located on the peripheral part of the opening 55, and an electron injection layer provided so as to cover them. FIG. 9 is a diagram showing the relationship between the openings 55 in the insulating layer 54 and the luminescent layer. In FIG. 9, the luminescent layer comprises a red luminescent layer 58R, a green luminescent layer 58G, and a blue luminescent layer 58B which are in a desired pattern larger than the openings 55.

Also in the active matrix-type organic electroluminescent device according to the present invention, the luminescent layer (a red luminescent layer 58R, a green luminescent layer 58G, and a blue luminescent layer 58B) is formed by the method for luminescent layer formation according to the present invention. The organic electroluminescent device is highly reliable, because the luminescent element layer provided so as to be extended onto the insulating layer 54 in its part on the periphery of the opening 55 can prevent shortcircuiting between the transparent electrode layer 53D and the electrode layer (not shown) located at a position where the luminescent element layer is held between the transparent electrode layer 53D and the electrode layer. Further, the luminescent layer in the luminescent element layer (a red luminescent layer 58R, a green luminescent layer 58G, and a blue luminescent layer 58B) is formed by the method according to the present invention, and, thus, the variation in thickness is not more than 10%, that is, the thickness is uniform, and high-quality display can be realized. As with the above embodiment, the luminescent element layer may have, for example, the following structures: a structure composed of a luminescent layer alone, a structure composed of a hole injection layer and a luminescent layer, a structure composed of a luminescent layer and an electron injection layer, a structure comprising a hole transport layer interposed between the hole injection layer and the luminescent layer, and a structure comprising an electron transport layer interposed between the luminescent layer and the electron injection layer.

Figure 10:
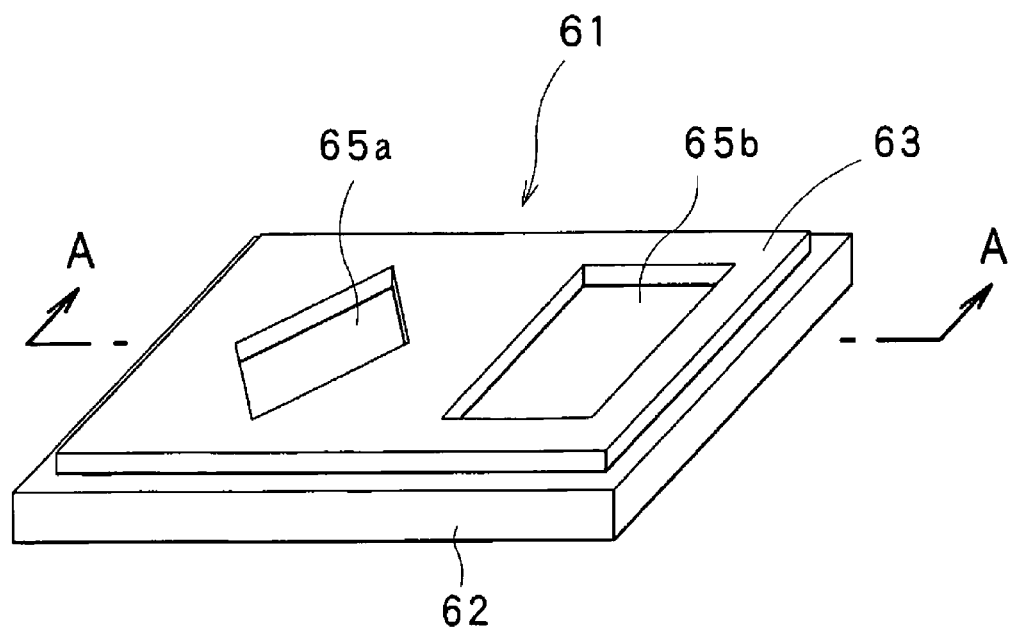
FIG. 10 is a perspective view showing still another embodiment of the organic electroluminescent device according to the present invention.
Figure 11:
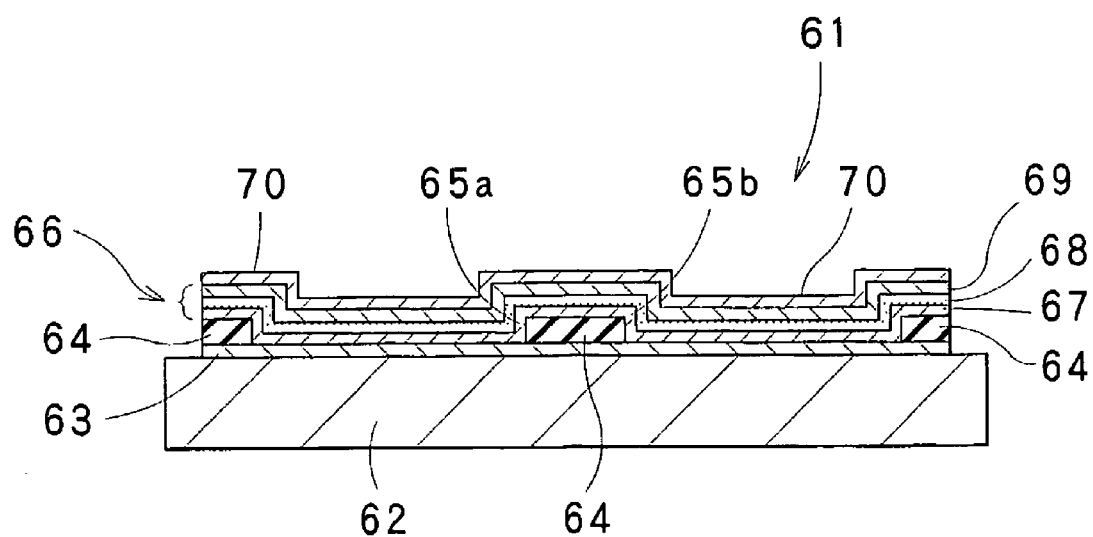
FIG. 11 is a cross-sectional view taken on line A-A of the organic electroluminescent device shown in FIG. 9.

FIG. 10 is a partial perspective view showing another embodiment of the organic electroluminescent device according to the present invention, and FIG. 11 is a cross-sectional view taken on line A-A of the organic electroluminescent device shown in FIG. 10. In FIGS. 10 and 11, an organic electroluminescent device 61 comprises a transparent base material 62, a transparent electrode layer 63 provided in a rectangular form on this transparent base material 62, an insulating layer 64 having a rhombic opening 65a and a rectangular opening 65b, a luminescent element layer 66 provided so as to cover the transparent electrode layer 63 within each of the openings 65a, 65b, and an electrode layer 70 provided so as to cover the luminescent element layer 66. The luminescent element layer 66 comprises a hole injection layer 67, a luminescent layer 68, and an electron injection layer 69 stacked in that order and is extended onto the insulating layer 64 on the periphery of the openings 65a, 65b. This organic electroluminescent device 61 is of an area color display type in which sites, where openings 65a, 65b are present, constitute a display area. The luminescent layer 68 in the luminescent element layer 66 is formed by the method for luminescent layer formation according to the present invention. In this organic electroluminescent device 61, The organic electroluminescent device 61 is highly reliable, because the luminescent element layer 66 provided so as to be extended onto the insulating layer 64 in its part on the periphery of the openings 65a, 65b can prevent shortcircuiting between the transparent electrode layer 63 and the electrode layer 70 located at a position where the luminescent element layer 66 is held between the transparent electrode layer 63 and the electrode layer 70. Further, the luminescent layer 68 in the luminescent element layer 66 is formed by the method according to the present invention, and, thus, the variation in thickness is not more than 10%, that is, the thickness is uniform. Accordingly, high-quality display can be realized.

The luminescent layer 68 may have such a size that is extended onto the insulating layer 64 in its part on the periphery of each of the openings 65a, 65b. Further, in this case, the luminescent layers located in the openings 65a, 65b may be different from each other in luminescence color. Further, the electrode layer 70 in its parts located respectively on the openings 65a, 65b may be rendered electrically independently of each other so that the luminescent layers can emit light independently of each other. As with the above embodiment, the luminescent element layer 66 may have, for example, the following structures: a structure composed of a luminescent layer alone, a structure composed of a hole injection layer and a luminescent layer, a structure composed of a luminescent layer and an electron injection layer, a structure comprising a hole transport layer interposed between the hole injection layer and the luminescent layer, and a structure comprising an electron transport layer interposed between the luminescent layer and the electron injection layer.

Figure 12:
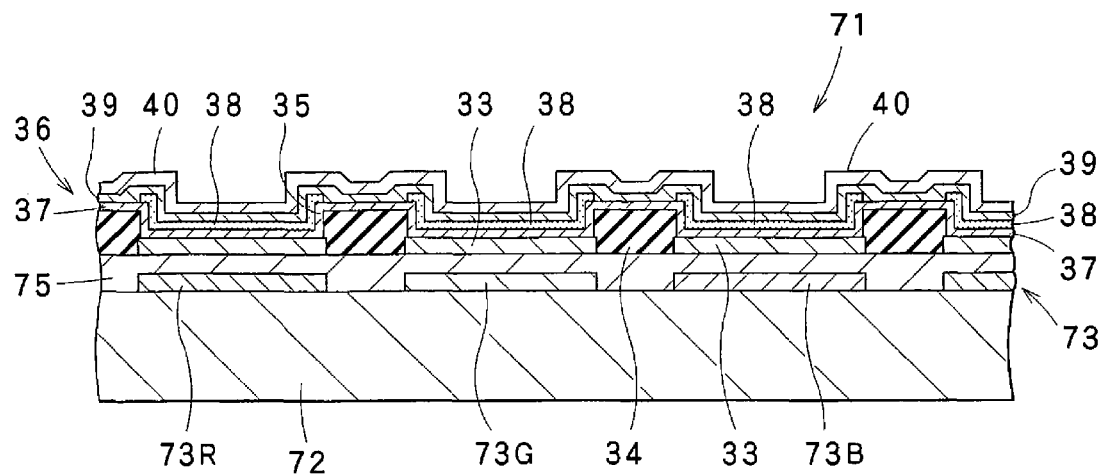
FIG. 12 is a partial cross-sectional view showing a further embodiment of the organic electroluminescent device according to the present invention.

The organic electroluminescent device according to the present invention is not limited to the above embodiments. FIG. 12 is a partial cross-sectional view showing other embodiment of the organic electroluminescent device according to the present invention. An organic electroluminescent device 71 shown in FIG. 12 includes a transparent base material 72. A color filter layer 73 comprising a red colored layer 73R, a green colored layer 73G, and a blue colored layer 73B is provided in a strip pattern on the transparent base material 72. A transparent smoothing layer 75 is provided so as to cover the color filter layer 73. A plurality of transparent electrode layers 33 in a strip pattern formed in the same manner as in the organic luminescent device 31 in the above embodiment are provided on the transparent smoothing layer 75. An insulating layer 34 is provided so that stripe-shaped openings 35 are located respectively on the transparent electrode layers 33. A luminescent element layer 36 is provided so as to cover the transparent electrode layers 33 located within the openings 35. A plurality of strip-patterned electrode layers 40 are provided on the luminescent element layer 36 so that they are orthogonal to the transparent electrode layers 33.

The plurality of transparent electrode layers 33 in a strip pattern are located on the strip-patterned red colored layer 73R, green colored layer 73G, and blue colored layer 73B. The luminescent element layer 36 comprises a hole injection layer 37 provided so as to cover the insulating layer 34 and the transparent electrode layer 33 located within each of the openings 35, a plurality of luminescent layers 38 provided for each opening 35 so as to cover the transparent electrode layer 33 (hole injection layer 37) located within the opening 35 and to be extended onto the insulating layer 34 in its part on the periphery of the opening 35, and an electron injection layer 39 provided so as to cover them. In the embodiment shown in the drawing, the luminescent layer 38 is a strip-patterned white luminescent layer.

The organic electroluminescent device 71 is the same as the organic electroluminescent device 31, except that the color filter layer 73 and the transparent smoothing layer 75 are provided and the luminescent layer 38 is a white luminescent layer. Accordingly, like members have the same reference numerals and, the detailed description thereof will be omitted. As with the above embodiments, the luminescent element layer 36 may have, for example, the following structures: a structure composed of a luminescent layer alone, a structure composed of a hole injection layer and a luminescent layer, a structure composed of a luminescent layer and an electron injection layer, a structure comprising a hole transport layer interposed between the hole injection layer and the luminescent layer, and a structure comprising an electron transport layer interposed between the luminescent layer and the electron injection layer.

The color filter layer 73 is provided for color correction of light from the luminescent element layer 36 and for enhancing color purity. The material for the red colored layer 73R, the green colored layer 73G, and the blue colored layer 73B constituting the color filter layer 73 may be properly selected depending upon luminescence characteristics of the luminescent element layer 36. For example, the color layer may be formed of a pigment dispersion composition containing a pigment, a pigment dispersant, a binder resin, a reactive compound, and a solvent. The thickness of the color filter 73 may be properly determined depending, for example, upon the material for each colored layer and luminescence characteristics of the organic EL element layer. For example, the thickness of the color filter may be in the range of about 1 to 3 μm.

When a difference in level (surface irregularities) is present due to the construction of the underlying layers (color filter 73 and the like), the transparent smoothing layer 75 has such a flattening function that eliminates this level difference for flattening and prevents uneven thickness in the luminescent element layer 36. The transparent smoothing layer 75 may be formed of a transparent (visible light transmittance: not less than 50%) resin. Specific examples of such resins include acrylate-type or methacrylate-type reactive vinyl-containing photocuring resins and heat curing resins. Transparent resins usable herein include polymethyl methacrylates, polyacrylates, polycarbonates, polyvinyl alcohols, polyvinyl pyrrolidones, hydroxyethylcelluloses, carboxymethylcelluloses, polyvinyl chloride resins, melamine resins, phenol resins, alkyd resins, epoxy resins, urethane resins, polyester resins, maleic acid resins, and polyamide resins. The thickness of the transparent smoothing layer 75 may be properly determined by taking into consideration the material used, in such a range that the smoothing function can be developed. For example, the thickness may be properly determined in the range of about 1 to 5 μm.

Figure 13:
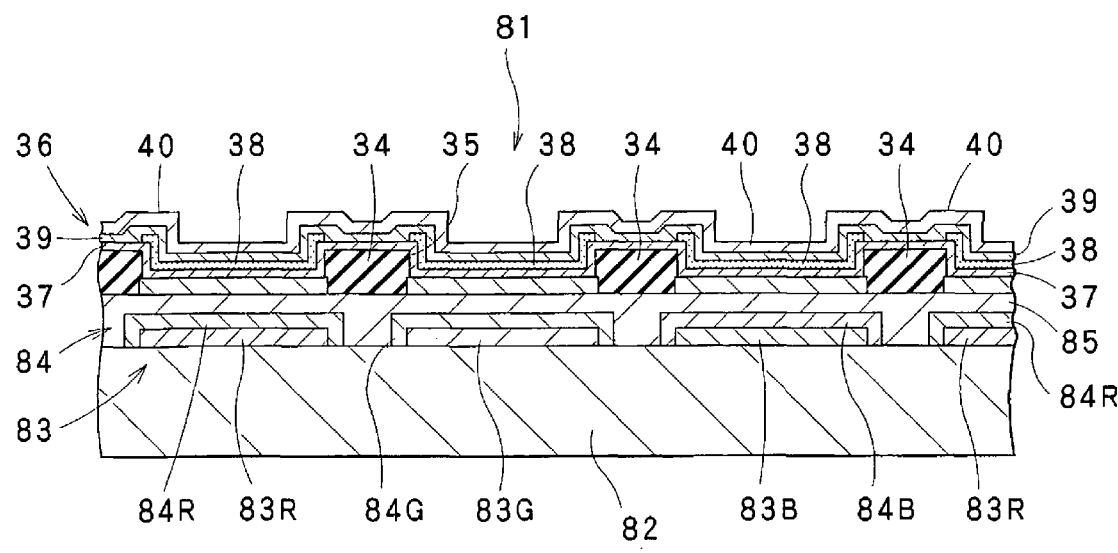
FIG. 13 is a partial cross-sectional view showing another embodiment of the organic electroluminescent device according to the present invention.

FIG. 13 is a partial cross-sectional view showing other embodiment of the organic electroluminescent device according to the present invention. An organic electroluminescent device 81 shown in FIG. 13 includes a transparent base material 82. A color filter layer 83 comprising a red colored layer 83R, a green colored layer 83G, and a blue colored layer 83B is provided in a strip pattern on the transparent base material 82. A color converting fluorescent material layer 84 comprises strip-patterned red converting fluorescent material layer 84R (a layer for converting blue light to red fluorescence), a green converting fluorescent material layer 84G (a layer for converting blue light to green fluorescence), and a blue converting dummy layer 84B (a layer for allowing blue light as such to be passed therethrough) are provided so as to respectively cover the red colored layer 83R, the green colored layer 83G, and the blue colored layer 83B in the color filter layer 83. A transparent smoothing layer 85 is provided so as to cover them. A plurality of transparent electrode layers 33 in a strip pattern are formed in the same manner as in the organic luminescent device 31 in the above embodiment are provided on the transparent smoothing layer 85. An insulating layer 34 is provided so that stripe-shaped openings 35 are located respectively on the transparent electrode layers 33. A luminescent element layer 36 is provided so as to cover the transparent electrode layers 33 located within the openings 35. A plurality of strip-patterned electrode layers 40 are provided on the luminescent element layer 36 so that they are orthogonal to the transparent electrode layers 33.

The plurality of transparent electrode layers 33 in a strip pattern are located on the strip-patterned red converting fluorescent material layer 84R, green converting fluorescent material layer 84G, and blue converting dummy layer 84B. The luminescent element layer 36 comprises a hole injection layer 37 provided so as to cover the insulating layer 34 and the transparent electrode layer 33 located within each of the openings 35, a plurality of luminescent layers 38 provided for each opening 35 so as to cover the transparent electrode layer 33 (hole injection layer 37) located within the opening 35 and to be extended onto the insulating layer 34 in its part on the periphery of the opening 35, and an electron injection layer 39 provided so as to cover them. In the embodiment shown in the drawing, the luminescent layer 38 is a strip-patterned blue luminescent layer.

The organic electroluminescent device 81 is the same as the organic electroluminescent device 31, except that the color filter layer 83, the color converting fluorescent material layer 84, and the transparent smoothing layer 85 are provided and the luminescent layer 38 is a blue luminescent layer. Accordingly, like members have the same reference numerals, and the detailed description thereof will be omitted. Further, the color filter layer 83 and the transparent smoothing layer 85 are the same as the color filter layer 73 and the transparent smoothing layer 75, and, thus, the detailed description thereof will be omitted. As with the above embodiments, the luminescent element layer 36 may have, for example, the following structures: a structure composed of a luminescent layer alone, a structure composed of a hole injection layer and a luminescent layer, a structure composed of a luminescent layer and an electron injection layer, a structure comprising a hole transport layer interposed between the hole injection layer and the luminescent layer, and a structure comprising an electron transport layer interposed between the luminescent layer and the electron injection layer.

The red converting fluorescent material layer 84R and the green converting fluorescent material layer 84G are a layer composed of a fluorescent coloring matter only, or a layer containing a fluorescent coloring matter contained in a resin. Examples of fluorescent coloring matters usable in the red converting fluorescent material layer 84R for converting blue luminescence to red fluorescence include cyanine coloring matters such as 4-dicyanomethylene-2-methyl-6-(p-dimethylaminostyryl)-4H-pyran, pyridine coloring matters such as 1-ethyl-2-[4-(p-dimethylaminophenyl)-1,3-butadienyl]-pyridium-perchlorate, rhodamine coloring matters such as Rhodamine B and Rhodamine 6G, and oxazine coloring matters. Fluorescent coloring matters usable in the green converting fluorescent material layer 84G for converting blue luminescence to green fluorescence include coumarin coloring matters such as 2,3,5,6-1H,4H-tetrahydro-8-trifluoromethylquinolidino(9,9a,1-gh)coumarin, 3-(2'-benzothiazolyl)-7-diethylaminocoumarin, 3-(2'-benzimidazolyl)-7-N,N-diethylaminocoumarin, coumarin dyes such as Basic Yellow 51, and naphthalimide coloring matters such as Solvent Yellow 11 and Solvent Yellow 116. Further, various dyes such as direct dyes, acid dyes, basic dyes, and disperse dyes may also be used so far as they have fluorescence. These fluorescent coloring matters may be used either solely or in a combination of two or more.

When the red converting fluorescent material layer 84R and the green converting fluorescent material layer 84G comprise a fluorescent coloring matter in a resin, the content of the fluorescent coloring matter may be properly determined by taking into consideration, for example, the fluorescent coloring matter used and the thickness of the color converting fluorescent material layer. For example, the content of the fluorescent coloring matter may be about 0.1 to 1 part by weight based on 100 parts by weight of the resin used.

The blue converting dummy layer 84B is a layer through which blue light emitted from the luminescent element layer 36 as such is passed and sent to the color filter layer 83. The blue converting dummy layer 84B may be a transparent resin layer having substantially the same thickness as the red converting fluorescent material layer 84R and the green converting fluorescent material layer 84G.

When the red converting fluorescent material layer 84R and the green converting fluorescent material layer 84G comprise a fluorescent coloring matter contained in a resin, transparent (visible light transmittance: not less than 50%) resins may be used as the resin. Examples of such resins include polymethyl methacrylates, polyacrylates, polycarbonates, polyvinyl alcohols, polyvinyl pyrrolidones, hydroxyethylcelluloses, carboxymethylcelluloses, polyvinyl chloride resins, melamine resins, phenol resins, alkyd resins, epoxy resins, urethane resins, polyester resins, maleic acid resins, and polyamide resins. When the pattern formation of the color converting fluorescent material layer 84 is carried out by photolithography, for example, acrylic acid-type, methacryl acid-type, polyvinylcinnamate-type, cyclized rubber-type or other reactive viny-containing photocuring resist resins may be used. Further, these resins may also be used in the blue converting dummy layer 84B.

When the red converting fluorescent material layer 84R and the green converting fluorescent material layer 84G constituting the color converting fluorescent layer 84 are composed of a fluorescent coloring matter only, they may be formed in a strip form, for example, by vacuum vapor deposition or sputtering through a desired pattern mask. On the other hand, when the red converting fluorescent material layer 84R and the green converting fluorescent material layer 84G are formed as a layer comprising a fluorescent coloring matter contained in a resin, they may be formed, for example, by providing a coating liquid prepared by dispersing or solubilizing a fluorescent coloring matter and a resin, coating the coating liquid by spin coating, roll coating, cast coating or the like to form a layer, patterning the layer by photolithography, or by printing the coating liquid in a pattern form by screen printing or the like. The blue converting dummy layer 84B may be formed, for example, by coating a desired photosensitive resin coating material by spin coating, roll coating, or cast coating to form a layer and patterning the layer by photolithography, or by printing a desired resin coating liquid in a pattern form by screen printing or the like.

The thickness of the color converting fluorescent material layer 84 should be such that the red converting fluorescent material layer 84R and the green converting fluorescent material layer 84G satisfactorily absorbs blue light emitted from the luminescent element layer 36 and emits fluorescence. The thickness may be properly determined by taking into consideration, for example, the fluorescent coloring matter used and the concentration of the fluorescent coloring matter and may be, for example, about 10 to 20 μm. The thickness of the red converting fluorescent material layer 84R and the thickness of the green converting fluorescent material layer 84G may be different from each other.

Blue luminescent organic materials include, for example, benzothiazole, benzimidazole, benzoxazole or other fluorescent brightening agents, metal chelated oxynoid compounds, styrylbenzene compounds, distyrylpyrazine derivatives and aromatic dimethylidine compounds.

Specific examples of fluorescent brightening agents include: benzothiazole fluorescent brightening agents such as 2,2'-(p-phenylenedivinylene)-bisbenzothiazole; benzimidazole fluorescent brightening agents such as 2-[2-[4-(2-benzimidazolyl)phenyl]vinyl]benzimidazole and 2-[2-(4-carboxyphenyl)vinyl]benzimidazole; and benzoxazole fluorescent brightening agents such as 2,5-bis(5,7-di-t-pentyl-2-benzoxazolyl)-1,3,4-thiadiazole, 4,4'-bis(5,7-t-pentyl-2-benzoxazolyl)stilbene, and 2-[2-(4-chlorophenyl)vinyl]naphth[1,2-d]oxazole.

Examples of metal chelated oxynoid compounds include tris(8-quinolinol)aluminum, bis(8-quinolinol)magnesium, bis(benzo[f]-8-quinolinol)zinc or other 8-hydroxyquinoline metal complexes and dilithiumepintridione.

Examples of styrylbenzene compounds include 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzene, 1,4-bis(3-ethylstyryl)benzene, 1,4-bis(2-methylstyryl)-2-methylbenzene, and 1,4-bis(2-methylstyryl)-2-ethylbenzene.

Examples of distyrylpyrazine derivatives include 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, and 2,5-bis[2-(1-pyrenyl)vinyl]pyrazine.

Examples of aromatic dimethylidene compounds include 1,4-phenylenedimethylidene, 4,4-phenylenedimethylidene, 2,5-xylenedimethylidene, 2,6-naphthylenedimethylidene, 1,4-biphenylenedimethylidene, 1,4-p-terephenylenedimethylidene, 9,10-anthracenediyldimethylidene, 4,4'-bis(2,2-di-t-butylphenylvinyl)biphenyl, 4,4'-bis(2,2-diphenylvinyl)biphenyl and other derivatives.

Additional examples of materials for a luminescent layer include compounds represented by general formula (Rs-Q)2-AL-O-L wherein AL represents a benzene ring-containing hydrocarbon having 6 to 24 carbon atoms; O-L represents a phenylate ligand; Q represents a substituted 8-quinolinolate ligand; and Rs represents an 8-quinolinolate substituent selected so that attachment of two or more substituted 8-quinolinolate ligands to the aluminum atom are sterically hindered. Specific examples thereof include bis(2-methyl-8-quinolinolate)(p-phenylphenolate)aluminum(III), and bis(2-methyl-8-quinolinolate)(1-naphtholate)aluminum(III). It should be noted that the above embodiments are illustrative only and are not intended to limit the scope of the present invention. For example, a black matrix may be provided in sites free from the color filter layers 73, 83.

EXAMPLES

The following Examples further illustrate the present invention.

Example 1

An ink A1 for a red luminescent layer according to the following formulation was prepared. The viscosity of this ink A1 was measured with a viscoelastometer (model MCR 301, manufactured by Physica) in a steady flow measurement mode under conditions of shear rate 100/sec and ink temperature 23° C. and was found to be 80 cP. The surface tension of mesitylene and tetralin used as solvents was measured at a liquid temperature of 20° C. with a surface tension balance (model CBVP-Z, manufactured by Kyowa Interface Science Co., Ltd.).

Composition of Ink A1 for Red Luminescent Layer
Polyfluorene derivative-type red luminescent material (molecular weight: 300,000) 2.5% by weight
Solvent (mixed solvent of mesitylene:tetralin=50:50) 97.5% by weight (Surface tension of mixed solvent=32 dynes/cm, boiling point=186° C.)

(Surface tension of mesitylene=28 dynes/cm, boiling point=165° C.)

(Surface tension of tetralin=35.5 dynes/cm, boiling point=207° C.)

Further, a plate-shaped gravure form (effective width 50 mm) provided with square cells (one side of cell 100 μm, cell depth 35 μm) arranged in a lattice form at cell intervals of 25 μm was provided. In this gravure form, the diagonal direction of the square cells was rendered consistent with the operating direction of a blanket which will be described later.

The following five types of resin films (F1 to F5) were formed by coating as a resin film. The surface tension of these resin films (width 150 mm) was measured as follows.

Resin Film
F1: Polypropylene film (Torayfan BO type 2500, manufactured by Toray Industries, Inc.), thickness 50 μm, surface tension 30 dynes/cm
F2: Melamine-baked polyethylene terephthalate film (PET 100 SG-1, manufactured by Panac Kogyo K.K.), thickness 100 μm, surface tension 35 dynes/cm
F3: Polyethylene terephthalate film (T60, manufactured by Toray Industries, Inc.), thickness 75 μm, surface tension 38 dynes/cm
F4: Polyethylene naphthalate film (Q51, manufactured by Teijin Ltd.), thickness 75 μm, surface tension 45 dynes/cm
F5: Easy-adhesion polyethylene terephthalate film (U10, manufactured by Toray Industries, Inc.), thickness 100 μm, surface tension 60 dynes/cm Method for Measurement of Surface Tension of Resin Film The contact angle θ was measured with an automatic contact angle goniometer (model DropMaster 700, manufactured by Kyowa Interface Science Co., Ltd.) using two or more liquids (standard substances) of which the surface tension is known. The surface tension of the resin films was determined based on the following equation: γs (surface tension of resin film)=γL (surface tension of liquid) cos θ+γSL (surface tension of resin film and liquid).

Next, each of the resin films (F1 to F5) was mounted on the circumferential surface of a blanket cylinder having on its surface a cushioning layer (hardness 700) with a diameter of 12 cm and a cylinder width of 30 cm to prepare five blankets. The hardness of the cushion layer is Type A hardness as measured by a durometer hardness test specified in JIS K 6253.

Next, The above gravure form and each blanket were mounted on a flat offset printing machine. The ink A1 for a red luminescent layer was supplied to the gravure form and was filled into cells, and an unnecessary portion of the ink A1 was removed with a blade. Next, a glass substrate subjected to cleaning treatment and ultraviolet plasma cleaning was provided as a base material. The blanket was allowed to receive the ink A1 from the gravure form. Thereafter, the ink A1 was transferred onto the glass substrate from the blanket to form a red luminescent layer (thickness about 70 nm). In this case, the printing speed was 1000 mm/sec, and drying was carried out on a hot plate set at 120° C. for one hr.

The blankets provided with resin films different from each other in surface tension as prepared above were used for observation of suitability for printing in the formation of a red luminescent layer. Further, a variation in thickness of the red luminescent layer [(maximum thickness−minimum thickness)/average thickness]×100 (%) was measured. The results were as shown in Table 1 below. The thickness of the red luminescent layer was measured with Nanopics 1000 manufactured by Seiko Instruments Inc. using a cantilever for a contact mode included as a standard device in this apparatus under conditions of measuring area 100 μm and scanning speed 90 sec/frame.

TABLE 1

| Blanket | Surface tension of resin film, dyne/cm | Suitability for printing | Variation in thickness, % |
|---|---|---|---|
| F1 | 30 | Poor in receptivity from gravure form | 25 |
| F2 | 35 | Good | 5 |
| F3 | 38 | Good | 3 |
| F4 | 45 | Good | 3 |
| F5 | 60 | Good | 5 |

As described in Table 1, a red luminescent layer which is satisfactory from the practical point of view can be formed by using blankets F2 to F5 with resin films having a surface tension of not less than 35 dynes/cm.

Example 2

Eight types of inks for a red luminescent layer (A1 to A8) were prepared using mixed solvents having boiling points as shown in Table 2 below, based on the ink A1 for a red luminescent layer used in Example 1. The surface tension of the mixed solvents was not more than 40 dynes/cm, and the viscosity of the inks as measured under conditions of ink temperature 23° C. and shear rate 100/sec was in the range of 5 to 200 cP.

On the other hand, the same gravure form as used in Example 1 was provided in this Example.

Resin film F3 (T60 manufactured by Toray Industries, Inc., thickness 75 μm, surface tension 38 dynes/cm) as described in Example 1 was mounted on the circumferential surface of the blanket cylinder as described in Example 1 to prepare a blanket.

Next, the above gravure form and blanket were mounted on a flat offset printing machine, and a red luminescent layer (thickness about 70 nm) was formed on a glass substrate using each of the inks for a red luminescent layer (A1 to A8) in the same manner as in Example 1. Drying was also carried out in the same manner as in Example 1.

The inks for a red luminescent layer (8 types) using solvents having different boiling points as prepared above were used for observing suitability for printing in the formation of a red luminescent layer. Further, a variation in thickness of the red luminescent layer [(maximum thickness−minimum thickness)/average thickness]×100 (%) was measured. The results were as shown in Table 2 below.

TABLE 2

| Ink used for red luminescent layer | Boiling point of solvent, °C. | Suitability for printing | Variation in thickness, % |
|---|---|---|---|
| A1 | 110 | Drying occurred in filling into gravure form. | — |
| A2 | 140 | Drying occurred immediately after transfer onto base material, resulting in occurrence of streaks. | 50 |
| A3 | 150 | Some streaks occurred. | 10 |
| A4 | 165 | Some streaks occurred. | 8 |
| A5 | 210 | Good | 5 |
| A6 | 240 | Good | 5 |
| A7 | 250 | Good | 5 |
| A8 | 270 | Drying was impossible in drying zone. | 5 |

As shown in Table 2, when the inks (A3 to A7) using solvents having a boiling point in the range of 150 to 250° C. were used, a red luminescent layer which is satisfactory from the practical point of view could be formed.

Example 3

Eight types of inks for a red luminescent layer (A'1 to A'8) were prepared using mixed solvents having surface tensions as shown in Table 3 below, based on the ink A1 for a red luminescent layer used in Example 1. The boiling point of the mixed solvents was in the range of 150 to 250° C., and the viscosity of the inks as measured under conditions of ink temperature 23° C. and shear rate 100/sec was in the range of 5 to 200 cP.

On the other hand, the same gravure form as used in Example 1 was provided in this Example.

Resin film F3 (T60 manufactured by Toray Industries, Inc., thickness 75 μm, surface tension 38 dynes/cm) as described in Example 1 was mounted on the circumferential surface of the blanket cylinder as described in Example 1 to prepare a blanket.

Next, the above gravure form and blanket were mounted on a flat offset printing machine, and a red luminescent layer (thickness about 70 nm) was formed on a glass substrate using each of the inks for a red luminescent layer (A'1 to A'8) in the same manner as in Example 1. Drying was also carried out in the same manner as in Example 1.

The inks for a red luminescent layer (8 types) using solvents having different surface tensions as prepared above were used for observing suitability for printing in the formation of a red luminescent layer. Further, a variation in thickness of the red luminescent layer [(maximum thickness−minimum thickness)/average thickness]×100 (%) was measured. The results were as shown in Table 3 below.

TABLE 3

| Ink used for red luminescent layer | Surface tension of solvent, dyne/cm | Suitability for printing | Variation in thickness, % |
|---|---|---|---|
| A'1 | 25 | Good | 5 |
| A'2 | 30 | Good | 4 |
| A'3 | 32 | Good | 2 |
| A'4 | 34 | Good | 4 |
| A'5 | 36 | Edge part was somewhat wavy. | 7 |
| A'6 | 38 | Edge part was somewhat wavy. | 8 |
| A'7 | 40 | Edge part was somewhat wavy. | 10 |
| A'8 | 42 | Poor in receptivity from gravure form | 15 |

As shown in Table 3, when the inks (A'1 to A'7) using solvents having a surface tension of not more than 40 dynes/cm were used, a red luminescent layer which is satisfactory from the practical point of view could be formed.

Example 4

Inks A"2 to A"12 for respective red luminescent layers (11 types), as shown in Table 4 below, of which the viscosity was 3 cP to 250 cP as measured under conditions of shear rate 100/sec and ink temperature 23° C., were prepared based on the ink A1 for a red luminescent layer used in Example 1. In this case, the content of the red luminescent material was properly varied in the range of 2 to 30% by weight, and, further, the mixing ratio of the mesitylene to tetralin in the mixed solvent was varied to properly vary the surface tension in the range of 25 to 40 dynes/cm and the boiling point in the range of 150 to 250° C.

On the other hand, the same gravure form as used in Example 1 was provided in this Example.

Resin film F3 (T60 manufactured by Toray Industries, Inc., thickness 75 μm, surface tension 38 dynes/cm) as described in Example 1 was mounted on the circumferential surface of the blanket cylinder as described in Example 1 to prepare a blanket.

Next, the above gravure form and blanket were mounted on a flat offset printing machine, and a red luminescent layer (thickness about 70 nm) was formed on a glass substrate using each of the inks for a red luminescent layer (A"1 to A"12) in the same manner as in Example 1. Drying was also carried out in the same manner as in Example 1.

The inks for a red luminescent layer (12 types) having different visocities as prepared above were used for observation of suitability for printing in the formation of a red luminescent layer. Further, a variation in thickness of the red luminescent layer [(maximum thickness−minimum thickness)/average thickness]×100 (%) was measured. The results were as shown in Table 4 below.

TABLE 4

| Ink used for red luminescent layer | Viscosity of ink, cP | Suitability for printing | Variation in thickness, % |
|---|---|---|---|
| A"2 | 3 | Layer lacked in layer thickness due to ink sagging. | 40 |
| A"3 | 5 | Spot-like unevenness occurred. | 20 |
| A"4 | 10 | Spot-like unevenness occurred. | 10 |
| A"5 | 20 | Spot-like unevenness somewhat occurred. | 7 |
| A"6 | 30 | Good | 5 |
| A"7 | 50 | Good | 3 |
| A"1 | 80 | Good | 3 |
| A"8 | 90 | Good | 3 |
| A"9 | 100 | Good | 5 |
| A"10 | 150 | Cell dot mark of gravure form somewhat remained. | 7 |

TABLE 4-continued

| Ink used for red luminescent layer | Viscosity of ink, cP | Suitability for printing | Variation in thickness, % |
|---|---|---|---|
| A"11 | 200 | Cell dot mark of gravure form remained. | 10 |
| A"12 | 250 | Impossible to be put to practical use due to the presence of gravure form cell dot mark-derived large concaves and convexes | 20 |

As shown in Table 4, a red luminescent layer which is satisfactory from the practical point of view can be formed by using inks having a viscosity of 5 to 200 cP (A"3 to A"7, A"1, and A"8 to A"11).

Example 5

Formation of Transparent Electrode Layer

A 200 nm-thick indium tin oxide (ITO) electrode film was first formed on a glass substrate (thickness 0.7 mm) by ion plating. A photosensitive resist was coated onto this ITO electrode film, and mask exposure, development, and etching of ITO electrode film were carried out to form 10 stripe-shaped transparent electrode layers having a width of 2.2 mm at pitches of 4 mm.

Formation of Insulating Layer

Next, the above glass substrate (thickness 0.7 mm) was subjected to cleaning treatment and ultraviolet plasma cleaning. Thereafter, a negative-working photosensitive resist composed mainly of an acrylic resin was spin coated and was patterned by a photolithographic process to form such an insulating layer (thickness 1 µm) that luminescent areas (openings) having a size of 2 mm×2 mm were provided at pitches of 4 mm on the respective transparent electrode layers.

Formation of Hole Injection Layer

Next, poly(3,4)ethylenedioxythiophene (PEDOT) (Baytron P CH 8000, manufactured by Bayer Ltd.) as an ink for a hole injection layer was spin coated, and the coating was dried on a hot plate set at 150° C. for 30 min to form a hole injection layer. This hole injection layer had a size of 50 mm×50 mm and was formed so as to cover the openings of the insulating layer. The rotating speed in the spin coating of PEDOT was regulated so that the thickness of the hole injection layer was 70 nm.

Formation of Red Luminescent Layer

The same gravure form as used in Example 1 was provided.

Further, resin film F3 (T60 manufactured by Toray Industries, Inc., thickness 75 µm, surface tension 38 dynes/cm) as described in Example 1 was mounted on the circumferential surface of the blanket cylinder as described in Example 1 to prepare a blanket.

The above gravure form and blanket were mounted on a flat offset printing machine, and, in the same manner as in Example 1, a red luminescent layer (thickness about 70 nm) was formed on the hole injection layer using the ink A1 for a red luminescent layer prepared in Example 1 (viscosity as measured under conditions of shear rate 100/sec and ink temperature 23° C.: 80 cp, surface tension of mixed solvent: 32 dynes/cm, boiling point: 186° C.).

Formation of Electron Injection Layer

A metal mask having 2.2 mm-width stripe-shaped openings provided at pitches of 4 mm was provided on the assembly in its red luminescent layer-formed side so that the openings were orthogonal to the stripe-shaped transparent electrode layers and were located on the luminescent areas (openings) in the insulating layer. Next, calcium was vapor deposited by vacuum vapor deposition (deposition rate=0.1 nm/sec) through this mask to form 10 electron injection layers (thickness 10 nm) at pitches of 4 mm.

Formation of Electrode Layer

Aluminum was then vapor deposited by vacuum vapor deposition (deposition rate=0.4 nm/sec) using the metal mask used for electron injection layer formation as such. Thus, a 2.21 nm-width stripe-shaped electrode layer (thickness 300 nm) of aluminum was formed on the electron injection layer.

Finally, a sealing plate was applied through an ultraviolet curing adhesive to the assembly on its electrode layer-formed side to prepare an organic electroluminescent device according to the present invention.

For this organic electroluminescent device, the luminescence efficiency at 1000 cd/m$^2$ and the luminescent element life in terms of the time necessary until the luminescence brightness in constant-current driving was halved, were evaluated and were found to be 0.9 cd/A and 30000 hr, respectively. The element life was evaluated by setting the current value to give an initial brightness of 100 cd/m$^2$, continuously driving the device at the current value, and measuring the time necessary for halving the brightness, that is, for reducing the brightness to 50 cd/m$^2$.

Example 6

An ink B for a green luminescent layer was prepared according to the following formulation. The viscosity of this ink B was measured in the same manner as in Example 1 under conditions of shear rate 100/sec and ink temperature 23° C. and was found to be 80 cP.

Composition of Ink B for Green Luminescent Layer
    Polyfluorene derivative-type green luminescent material (molecular weight: 200,000) 2.5% by weight
    Solvent (mixed solvent of mesitylene:tetralin=67:33) 97.5% by weight (Surface tension of mixed solvent=33 dynes/cm, boiling point=193° C.)

An organic electroluminescent device was prepared in the same manner as in Example 5, except that this ink B for a green luminescent layer was used. For this organic electroluminescent device, the luminescence efficiency at 1000 cd/m$^2$ and the luminescent element life in terms of the time necessary until the luminescence brightness in constant-current driving was halved, were evaluated and were found to be 8.5 cd/A and 20000 hr, respectively.

Example 7

An ink C for a blue luminescent layer was prepared according to the following formulation. The viscosity of this ink C was measured in the same manner as in Example 1 under conditions of shear rate 100/sec and ink temperature 23° C. and was found to be 60 cP.

Composition of Ink C for Blue Luminescent Layer
    Polyfluorene derivative-type blue luminescent material (molecular weight: 300,000) 2.5% by weight
    Solvent (mixed solvent of mesitylene:tetralin=25:75) 97.5% by weight (Surface tension of mixed solvent=34 dynes/cm, boiling point=197° C.)

An organic electroluminescent device was prepared in the same manner as in Example 5, except that this ink C for a blue luminescent layer was used and, further, in the formation of the electron injection layer, prior to the formation of the calcium layer by vacuum vapor deposition, a 1 nm-thick lithium fluoride layer was formed by vacuum vapor deposition (deposition rate=0.01 nm/sec).

For this organic electroluminescent device, the luminescence efficiency at 1000 cd/m$^2$ and the luminescent element life in terms of the time necessary until the luminescence brightness in constant-current driving was halved, were evaluated and were found to be 4.0 cd/A and 1000 hr, respectively.

Example 8

An ink D for a white luminescent layer was prepared according to the following formulation. The viscosity of this ink D was measured in the same manner as in Example 1 under conditions of shear rate 100/sec and ink temperature 23° C. and was found to be 45 cP.

Composition of ink D for white luminescent layer
Polyfluorene derivative-type white luminescent material (molecular weight: 300,000) 20.5% by weight
Solvent (mixed solvent of mesitylene:tetralin=25:75) 97.5% by weight (Surface tension of mixed solvent=34 dynes/cm, boiling point=197° C.)

An organic electroluminescent device was prepared in the same manner as in Example 5, except that this ink D for a white luminescent layer was used. For this organic electroluminescent device, the luminescence efficiency at 1000 cd/m$^2$ and the luminescent element life in terms of the time necessary until the luminescence brightness in constant-current driving was halved, were evaluated and were found to be 4.0 cd/A and 1000 hr, respectively.

The invention claimed is:

1. A method for the formation of a luminescent layer in an organic electroluminescent device comprising opposed electrodes, a luminescent element layer provided between the electrodes, the luminescent element layer comprising at least a luminescent layer, the method comprising the steps of:
    filling an ink, for a luminescent layer, comprising at least an organic luminescent material into cells in a gravure form;
    allowing a blanket to receive the ink for a luminescent layer from the cells; and
    then transferring the ink for a luminescent layer on the blanket onto a luminescent layer forming face, wherein
    the blanket has a resin film having a surface tension of not less than 35 dynes/cm as a surface layer,
    the ink for a luminescent layer has a viscosity (ink temperature 23° C.) in the range of 5 to 200 cP as measured at a shear rate of 100/sec, and
    a solvent having a surface tension of not more than 40 dynes/cm and a boiling temperature in the range of 150 to 250° C. is used in the ink for a luminescent layer.

2. The method according to claim 1, wherein the resin film has a thickness of 5 to 200 μm.

3. The method according to claim 1, wherein the blanket comprises the resin film provided integrally on the circumferential surface of a blanket cylinder.

4. The method according to claim 3, wherein a cushioning layer is provided on the surface of the blanket cylinder.

5. The method according to claim 1, wherein the resin film is transferred in such a state that the resin film is wound around the circumferential surface of the blanket cylinder being rotated in its portion ranging at least from a position where the ink for a luminescent layer is received from the gravure form, to a position where the ink for a luminescent layer is transferred to the luminescent layer forming face.

6. The method according to claim 1, wherein the content of the organic luminescent material in the ink for a luminescent layer is in the range of 1.5 to 4.0% by weight.

7. The method according to claim 1, wherein cells in the gravure form has a maximum opening length in the range of 20 to 200 μm and a depth of 10 to 200 μm.

8. The method according to claim 1, wherein, in the gravure form, a plurality of cells constitute a pattern for one area color, and the width of one pattern is not less than 200 μm.

9. The method according to claim 8, wherein the gravure form is divided into a plurality of compartments in an axial direction, and any desired ink for a luminescent layer is supplied for each of the compartments to simultaneously form a plurality of luminescent layers different from each other in luminescent color.

10. The method according to claim 1, wherein a plurality of luminescent layers different from each other in luminescent color are continuously formed using a plurality of pairs of gravure forms and blankets.

* * * * *